United States Patent
Coffey et al.

(10) Patent No.: US 7,200,929 B2
(45) Date of Patent: Apr. 10, 2007

(54) PATCH PANEL WITH MODULES

(75) Inventors: Joseph C. Coffey, Burnsville, MN (US); John D. Schmidt, Minneapolis, MN (US); Bruce C. Ogren, Edina, MN (US); Karl J. Peterson, St. Paul, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 318 days.

(21) Appl. No.: 10/871,698

(22) Filed: Jun. 18, 2004

(65) Prior Publication Data

US 2005/0221660 A1 Oct. 6, 2005

Related U.S. Application Data

(63) Continuation-in-part of application No. 10/814,107, filed on Mar. 31, 2004.

(51) Int. Cl.
*H01R 43/00* (2006.01)

(52) U.S. Cl. .............................. 29/857; 29/825; 29/868; 29/869

(58) Field of Classification Search .................. 29/825, 29/857, 868, 869, 888
See application file for complete search history.

(56) References Cited

U.S. PATENT DOCUMENTS

| | | | |
|---|---|---|---|
| 4,840,568 A | 6/1989 | Burroughs et al. | |
| 5,199,878 A | 4/1993 | Dewey et al. | |
| 5,214,673 A | 5/1993 | Morgenstern et al. | |
| 5,286,215 A | 2/1994 | Dewey et al. | |
| 5,393,249 A | 2/1995 | Morgenstern et al. | |
| 5,467,062 A | 11/1995 | Burroughs | |
| 5,546,282 A * | 8/1996 | Hill et al. ................... | 361/796 |
| 5,575,665 A * | 11/1996 | Shramawick et al. ......... | 439/49 |
| 5,685,741 A | 11/1997 | Dewey et al. | |
| 6,053,764 A * | 4/2000 | Curry et al. ................ | 439/557 |
| 6,116,961 A | 9/2000 | Henneberger et al. | |
| RE37,125 E * | 4/2001 | Carlson et al. ............. | 398/141 |
| 6,223,909 B1 * | 5/2001 | Mendoza ..................... | 211/26 |
| 6,504,726 B1 * | 1/2003 | Grabinger et al. .......... | 361/796 |
| 6,511,330 B1 | 1/2003 | Norris | |
| 6,535,602 B1 * | 3/2003 | Jennison ..................... | 379/326 |
| 6,537,106 B1 * | 3/2003 | Follingstad ................. | 439/534 |
| 6,554,652 B1 | 4/2003 | Musolf et al. | |
| 6,589,062 B1 | 7/2003 | Ogren et al. | |
| 6,608,764 B2 * | 8/2003 | Clark et al. ................. | 361/796 |
| 6,623,278 B2 * | 9/2003 | Follingstad et al. .......... | 439/64 |
| 7,054,163 B2 * | 5/2006 | Coffey ........................ | 361/796 |
| 2002/0119681 A1 * | 8/2002 | Follingstad et al. .......... | 439/64 |
| 2003/0064611 A1 * | 4/2003 | Musolf et al. ................ | 439/43 |

FOREIGN PATENT DOCUMENTS

WO    WO 02/39756 A1 *   5/2002

\* cited by examiner

*Primary Examiner*—Carl J. Arbes
(74) *Attorney, Agent, or Firm*—Merchant & Gould P.C.

(57) ABSTRACT

A patch panel includes a back plane having front mounted pairs of termination locations, and an interconnect location electrically connected to each pair of termination locations. The termination locations connect to two patch cords. The interconnect location defines an access device for selectively accessing the termination locations. An interconnect module interfaces with the interconnect location. The module can include test access, power over Ethernet, or circuit protection features.

7 Claims, 24 Drawing Sheets

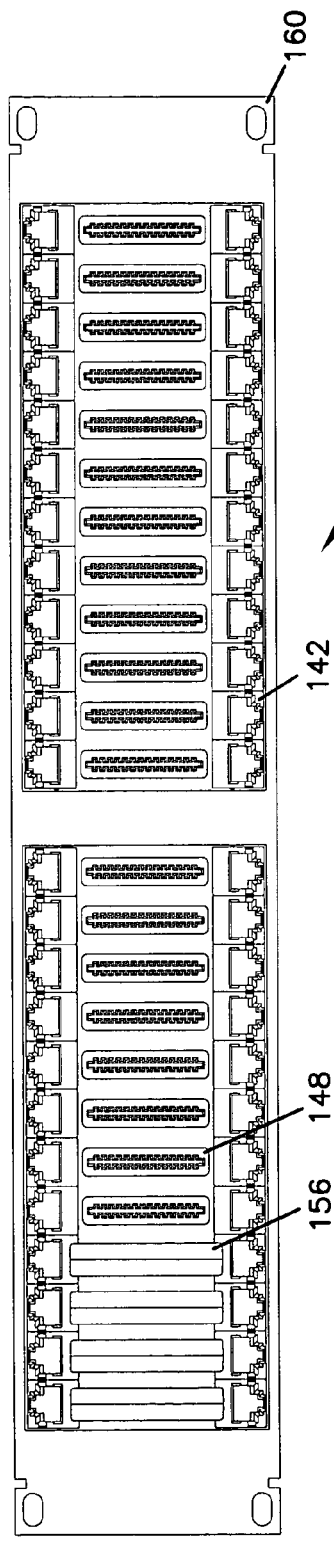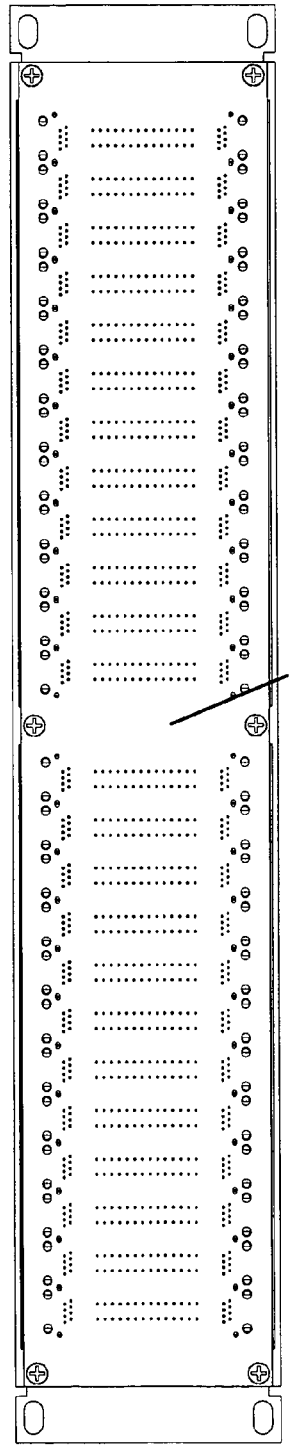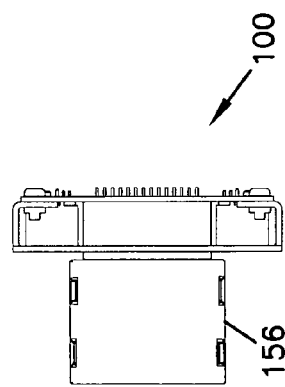
FIG.9
FIG.10
FIG.11

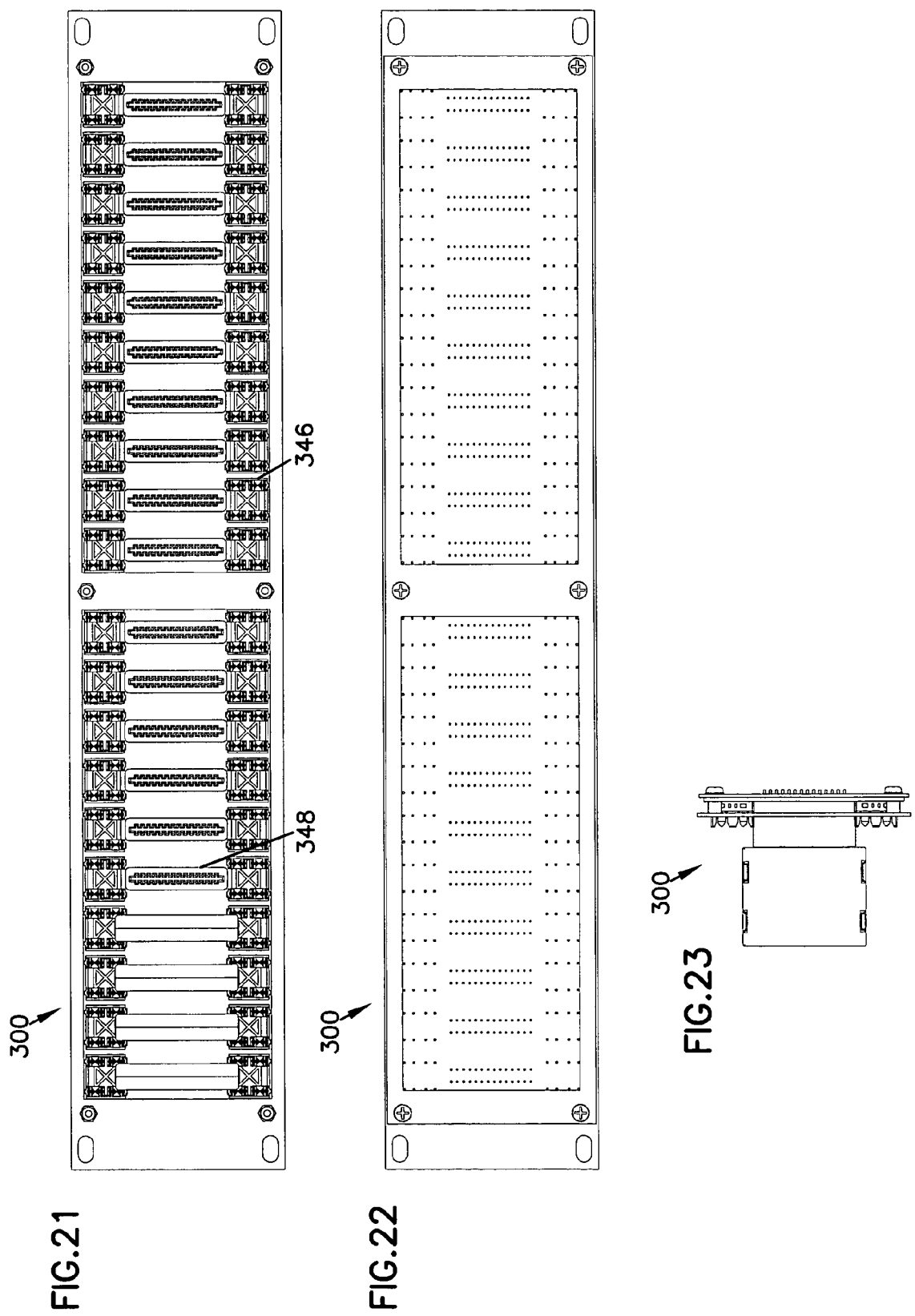

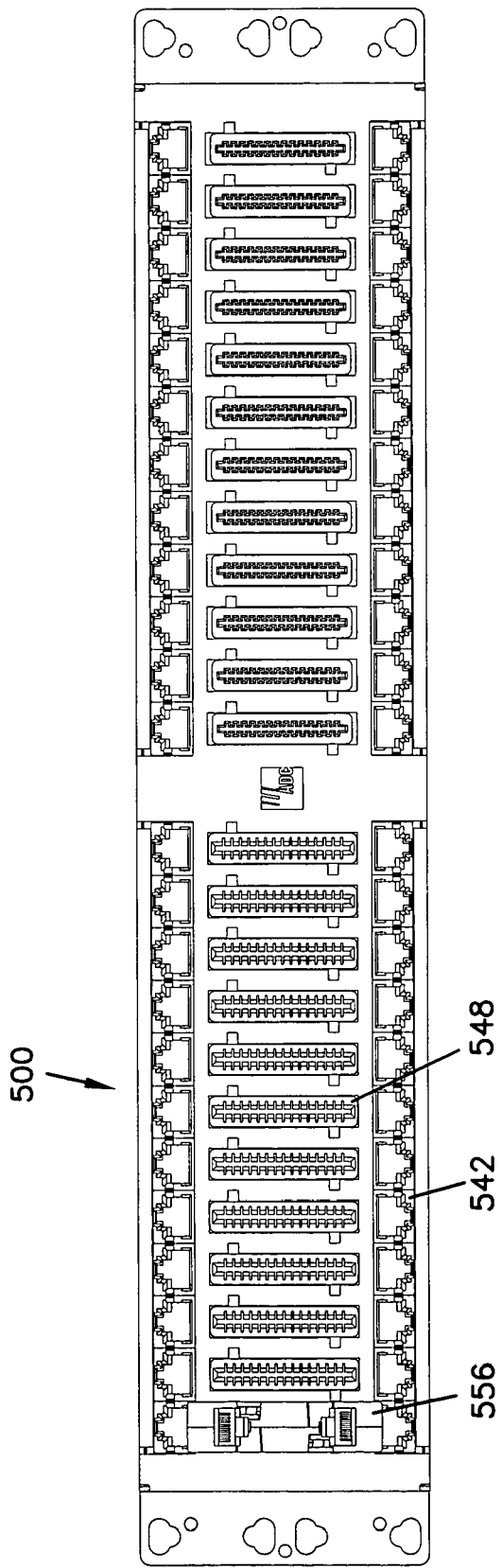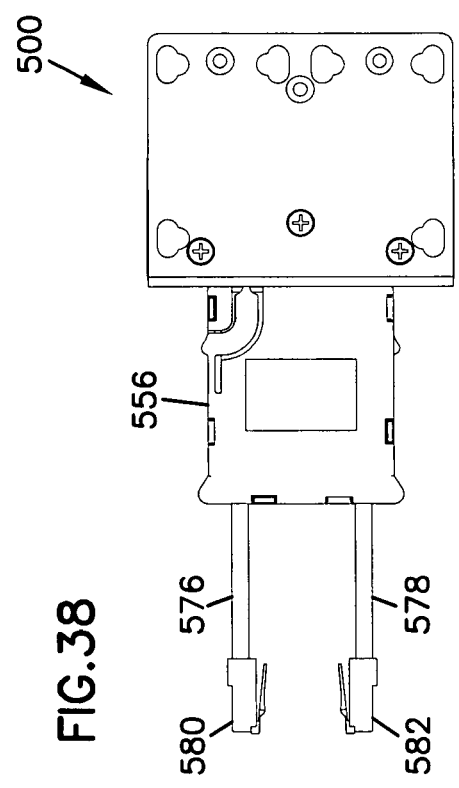

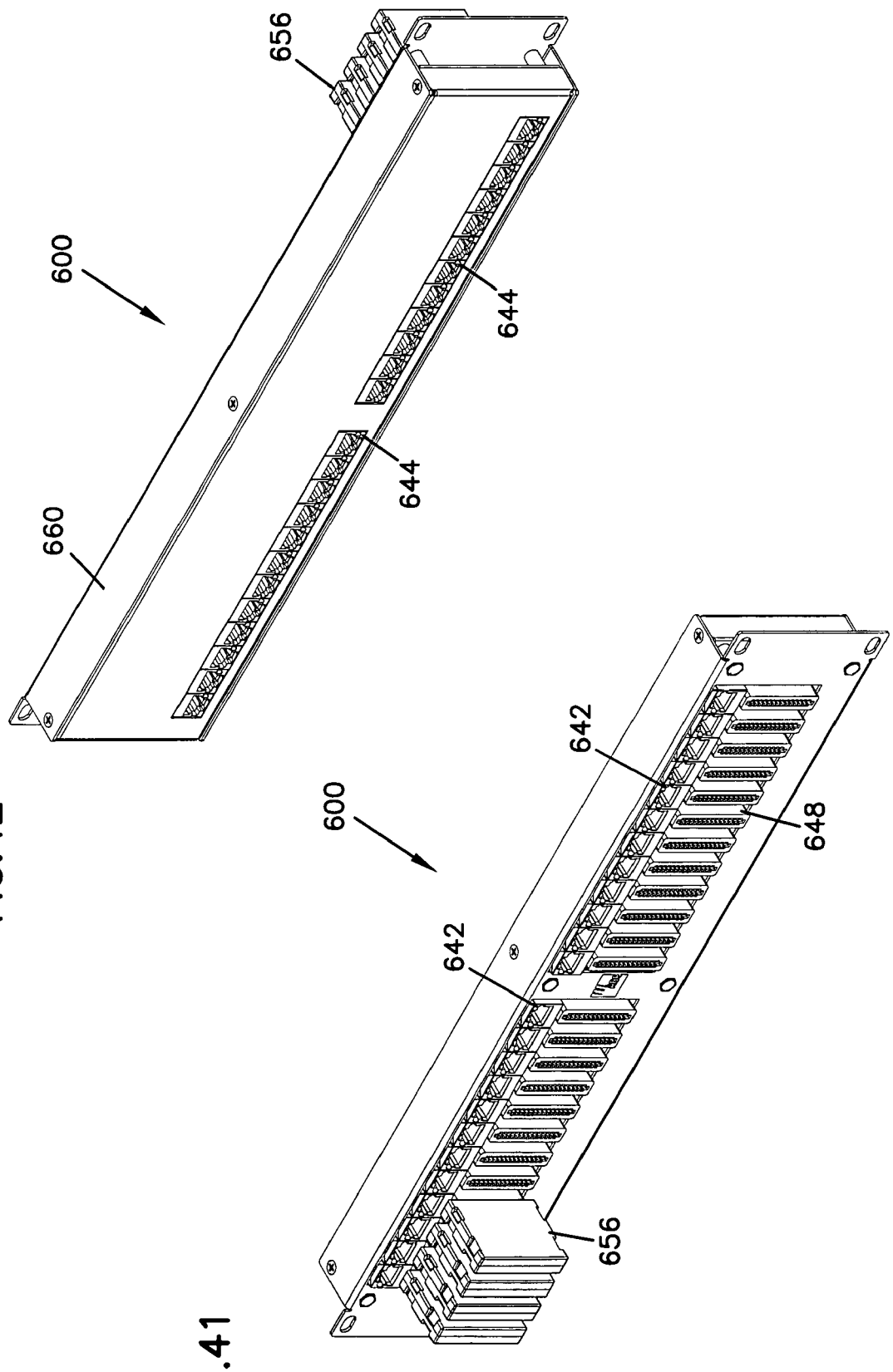

US 7,200,929 B2

PATCH PANEL WITH MODULES

RELATED APPLICATION

This is a continuation-in-part application of U.S. application Ser. No. 10/814,107, filed Mar. 31, 2004 entitled, "PATCH PANEL WITH MODULES."

TECHNICAL FIELD

The disclosure generally relates to devices and assemblies for patch panel systems. More particularly, this disclosure relates to a patch panel with access modules.

BACKGROUND OF THE INVENTION

Patch panels are used to provide an interconnection between network elements. Patch panels typically include interconnecting circuitry positioned on or within a housing or other panel structure for connecting two telecommunications cables. Conventional interconnecting circuitry includes jacks and other cable interface structures which are electrically connected in order to electrically connect the telecommunications cables.

In general, improvement has been sought with respect to such systems and arrangements to provide additional functionality and usability.

SUMMARY OF THE INVENTION

One aspect of the present disclosure relates to a patch panel including a back plane having a front major surface and a back major surface facing in an opposite direction. A plurality of pairs of termination locations are mounted to the back plane. Each termination location includes a patch cord access device including electrical contacts connected to the back plane for electrically connecting to conductors in the patch cord. A plurality of interconnect locations mounted to the back plane provide access to the termination locations.

Each interconnect location preferably defines a card edge socket with normally connected contact pairs connected to the back plane. Circuitry on the back plane connects each pair of termination locations to one of the interconnect locations.

Under normal conditions, the patch panel electrically connects two telecommunications cables connected at the termination locations. The interconnect location allows selective access to the termination locations.

In one preferred embodiment, an interconnect module defines an edge contact sized for receipt in one of the card edge sockets of the interconnect locations. The interconnect module adds functionality to the circuit, such as test access, power over Ethernet, or circuit protection features.

BRIEF DESCRIPTION OF THE DRAWINGS

FIG. 9 is a front view of a second embodiment of a patch panel.
FIG. 10 is a back view of the patch panel of FIG. 9.
FIG. 11 is a side view of the patch panel of FIG. 9.
FIG. 21 is a front view of a fourth embodiment of a patch panel.
FIG. 22 is a back view of the patch panel of FIG. 21.
FIG. 23 is a side view of the patch panel of FIG. 21.
FIG. 37 is a front view of the patch panel of FIG. 33.
FIG. 38 is a side view of the patch panel of FIG. 33.
FIG. 41 is a perspective view of a sixth embodiment of a patch panel including four modules mounted to interconnect locations.
FIG. 42 is a rear perspective view of the patch panel of FIG. 41.

DETAILED DESCRIPTION OF THE PREFERRED EMBODIMENTS

Figure 1:
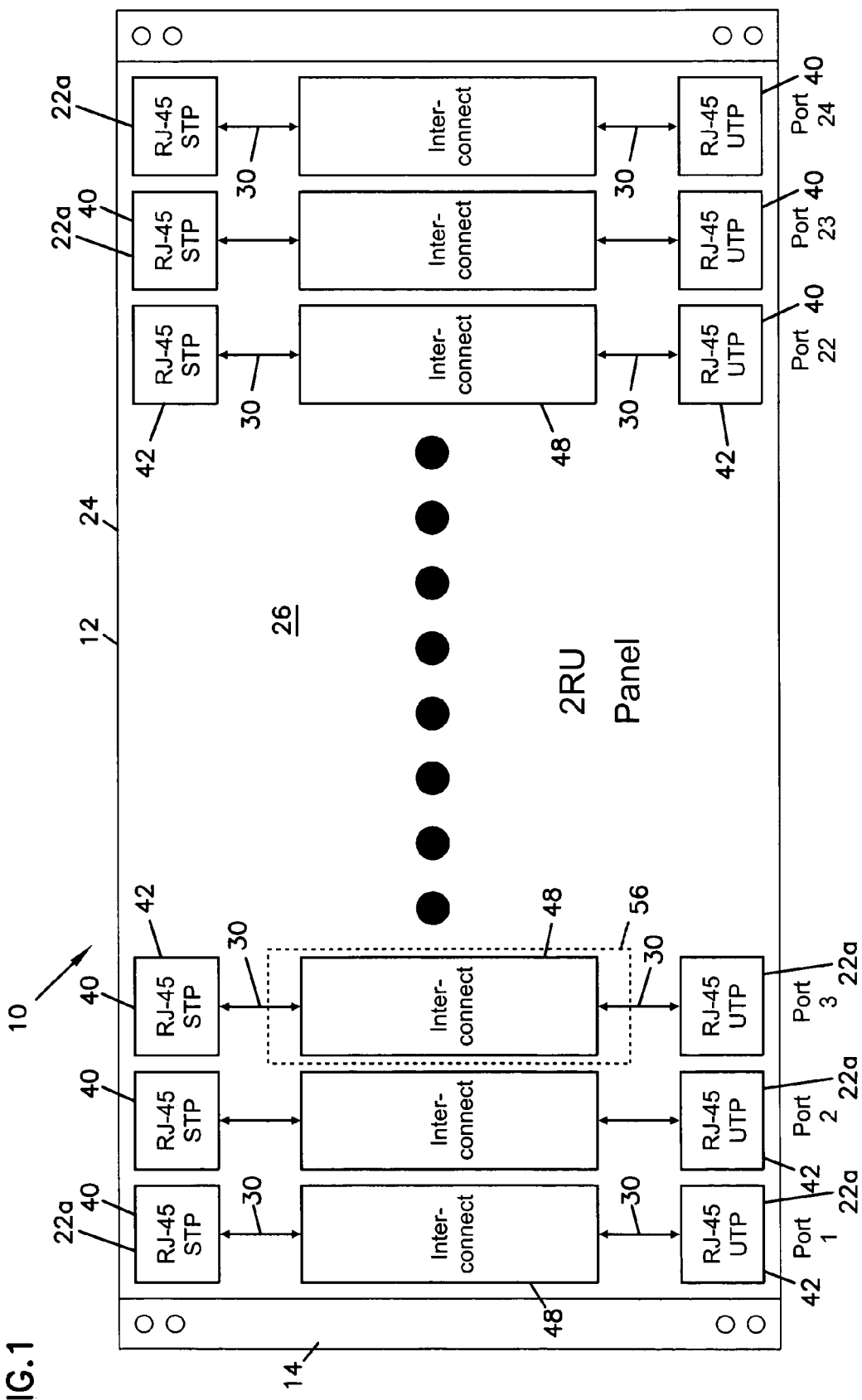
FIG. 1 is a front view of a patch panel in accordance with one embodiment of the present invention.
Figure 2:
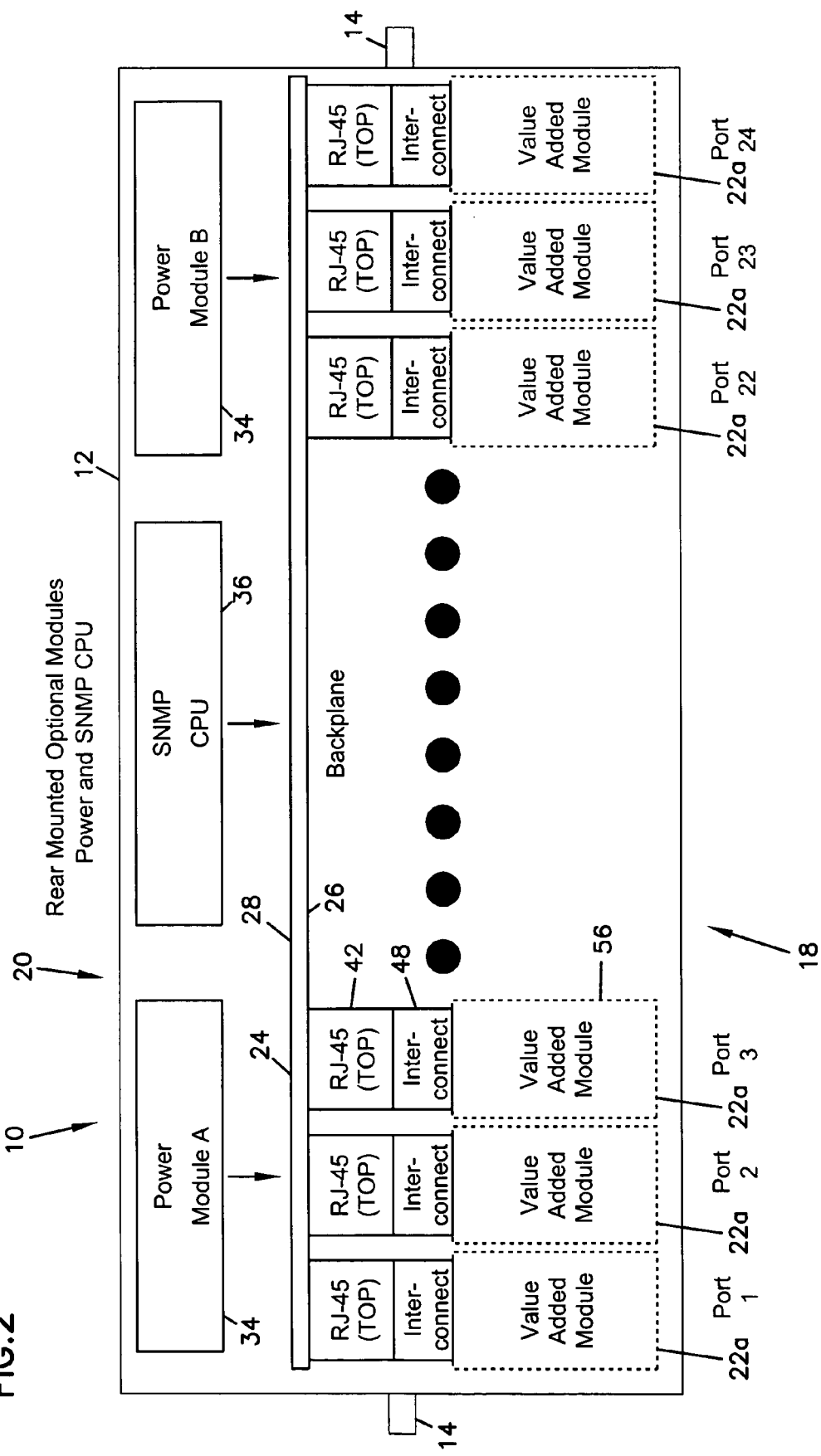
FIG. 2 is a top view of the patch panel of FIG. 1.

Referring now to FIGS. 1 and 2, one preferred embodiment of a patch panel 10 is shown. Patch panel 10 includes a chassis 12 which can be rack mounted or mounted to other frames or cabinets. Brackets 14 are used to mount chassis 12 to a rack. Patch panel 10 has a front 18, and an opposite back 20. Brackets 14 are located on sides 16. As will be described in further detail below, the preferred embodiment is front accessible for the cables connected through patch panel 10.

Patch panel 10 includes a plurality of patching circuits 22a. Alternatively, patching circuits 22a can be referred to as ports 22a. In the illustrated embodiment, 24 patching circuits 22a are provided. Other numbers of circuits can be provided as desired.

Patch panel 10 includes a back plane 24 having a front major surface 26 and an opposite facing back major surface 28. As will be described below, circuitry 30 including tracings 32 (FIG. 4) connect the various elements of patching circuit 22a.

Patch panel 10 can be powerless and without external control features. In some preferred embodiments, power modules 34 can be provided to introduce power into patch panel 10, such as for power over Ethernet functions. The power modules 34 (two are shown in FIG. 2) can be mounted to back major surface 28 of back plane 24. A CPU module 36 can also be mounted to back plane 24 at back major surface 28 to provide for system control, if desired. The CPU module can be installed for local and remote management for control and status monitoring.

Patch panel 10 includes pairs of connectors 40, also referred to as termination locations 40, for connecting to patch cords. Each connector 40 includes a patch cord access including electrical contacts for electrically connecting to back plane 24. Further, the patch cord access electrically connects to conductors in the patch cord. As will be described in greater detail, connectors 40 can include RJ45 connectors 42 or insulation displacement connectors (IDC's) 46 (see FIGS. 3B, 3C and 4). Other data connectors can be used, such as DB-9 connectors.

Circuitry 30 on back plane 24 connects to the pairs of connectors 40. Circuitry 30 also connects to an interconnect location 48 associated with each patching circuit 22a and the other patching circuits described herein. Interconnect location 48 defines a selective access location for accessing the electrical connections between the pairs of connectors 40. Interconnect location 48 in the preferred embodiment includes a plurality of normally connected or closed contact pairs connected to the back plane. The normally connected contact pairs can be interrupted by the introduction of an interconnect module 56. Preferably, the contact-pairs are make before break contact pairs.

Other contact pairs in interconnect location 48 can be normally open. Such contacts can be dedicated power contacts or control signal contacts.

Figure 5:
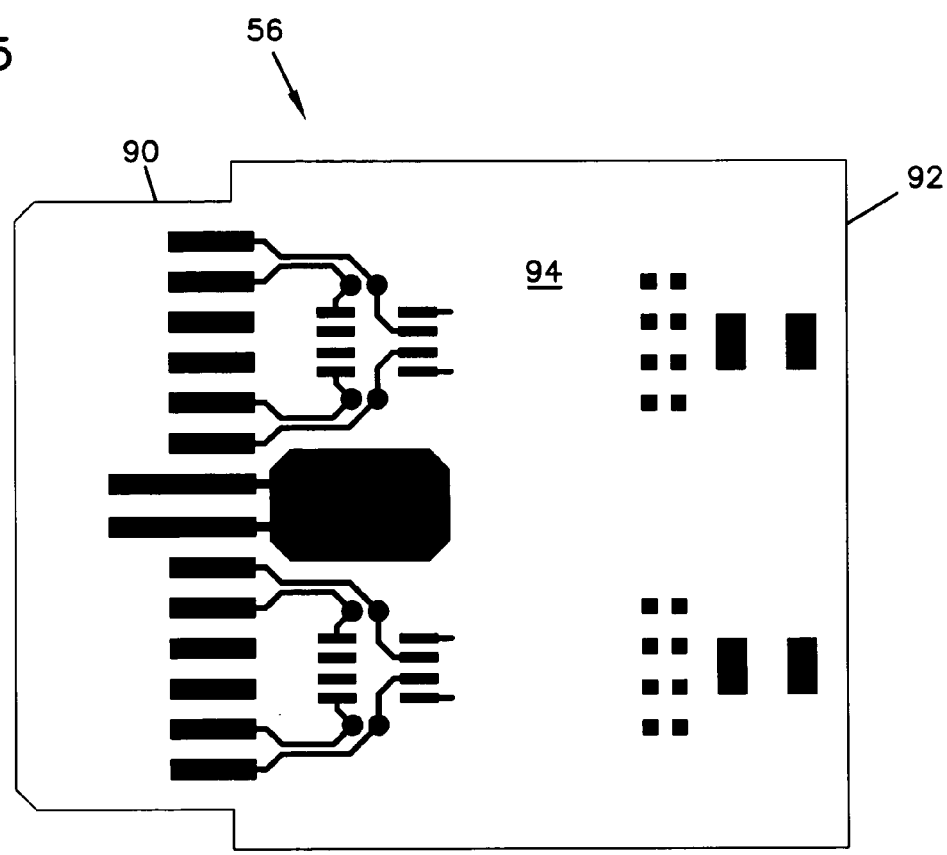
FIG. 5 is a side view of an interconnect module.
Figure 6:
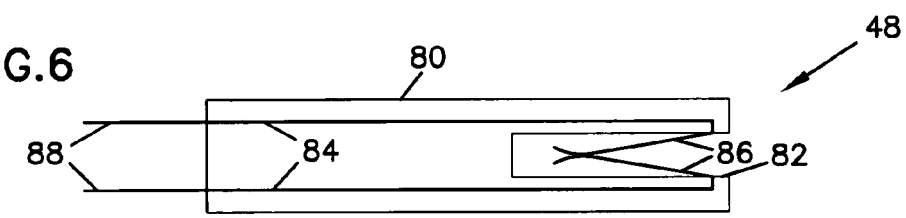
FIG. 6 is an end view of the interconnect location.

In one preferred embodiment, interconnect location 48 defines a card edge socket (FIG. 6). Each interconnect module 56 includes a card edge for mating with the card edge socket (FIG. 5).

Figure 3C:
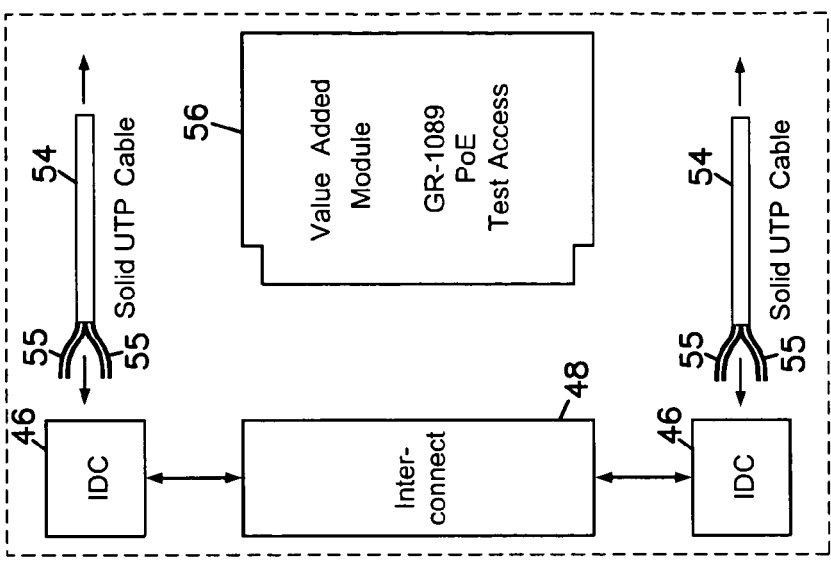
FIG. 3C is a schematic showing a third patching circuit including two insulation displacement contacts.
Figure 3B:
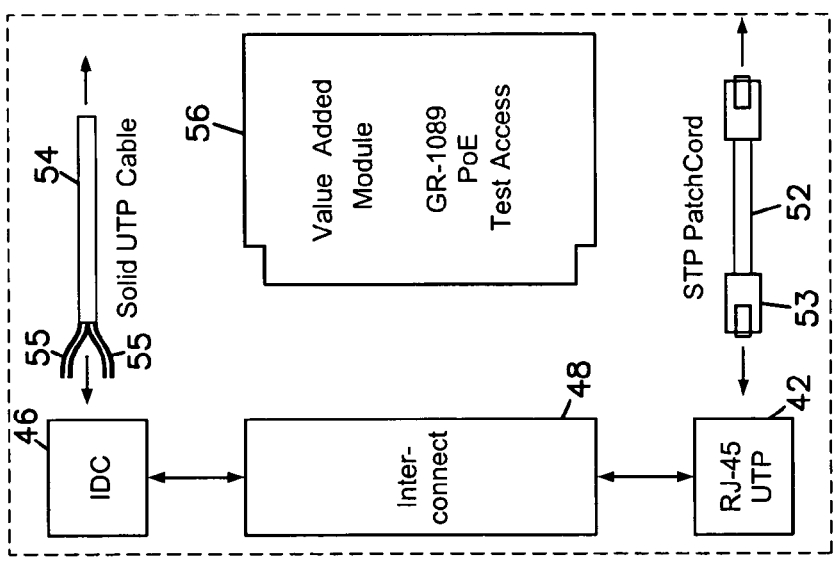
FIG. 3B is a schematic showing a second patching circuit including one RJ45 jack and one insulation displacement contact.
Figure 3A:
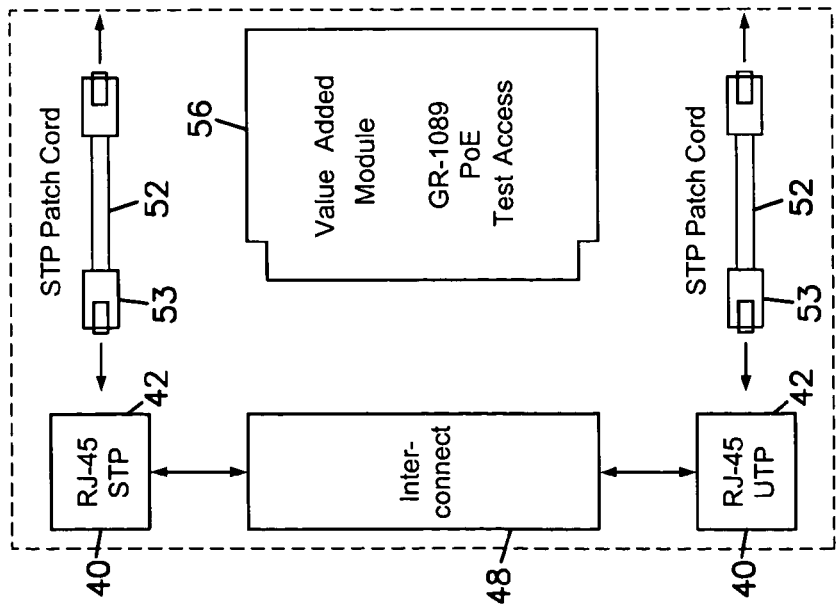
FIG. 3A is a schematic showing one patching circuit including two RJ45 jacks.

Referring now to FIG. 3A, patching circuit 22a is shown schematically. Two connectors 40 in the form of RJ45 connectors or jacks 42 are electrically connected through back plane 24 and interconnect location 48. RJ45 jacks 42 mate with patch cords 52. Patch cord 52 includes plug ends 53. Interconnect module 56 mates with interconnect location 48. Module 56 can be provided with functionality, as desired. For example, interconnect module 56 can provide test access, in an intrusive manner, or in a non-intrusive manner, as a monitor. Module 56 could alternatively be provided with circuitry for providing power over Ethernet (PoE) or GR-1089 or other circuit protection. Circuit protection features can include over voltage protection across each pair of connectors 40.

Referring now to FIG. 3B, instead of two RJ45 jacks as in FIG. 3A, patching circuit 22b includes one RJ45 jack 42, and one insulation displacement connector 46 for connecting patch cords 52, 54, respectively. Patch cord 54 includes individual wires 55 which are mated to insulation displacement connector 46.

Referring now to FIG. 3C, patching circuit 22c is provided with two insulation displacement connectors 46 for connecting two patch cords 54.

Figure 4:
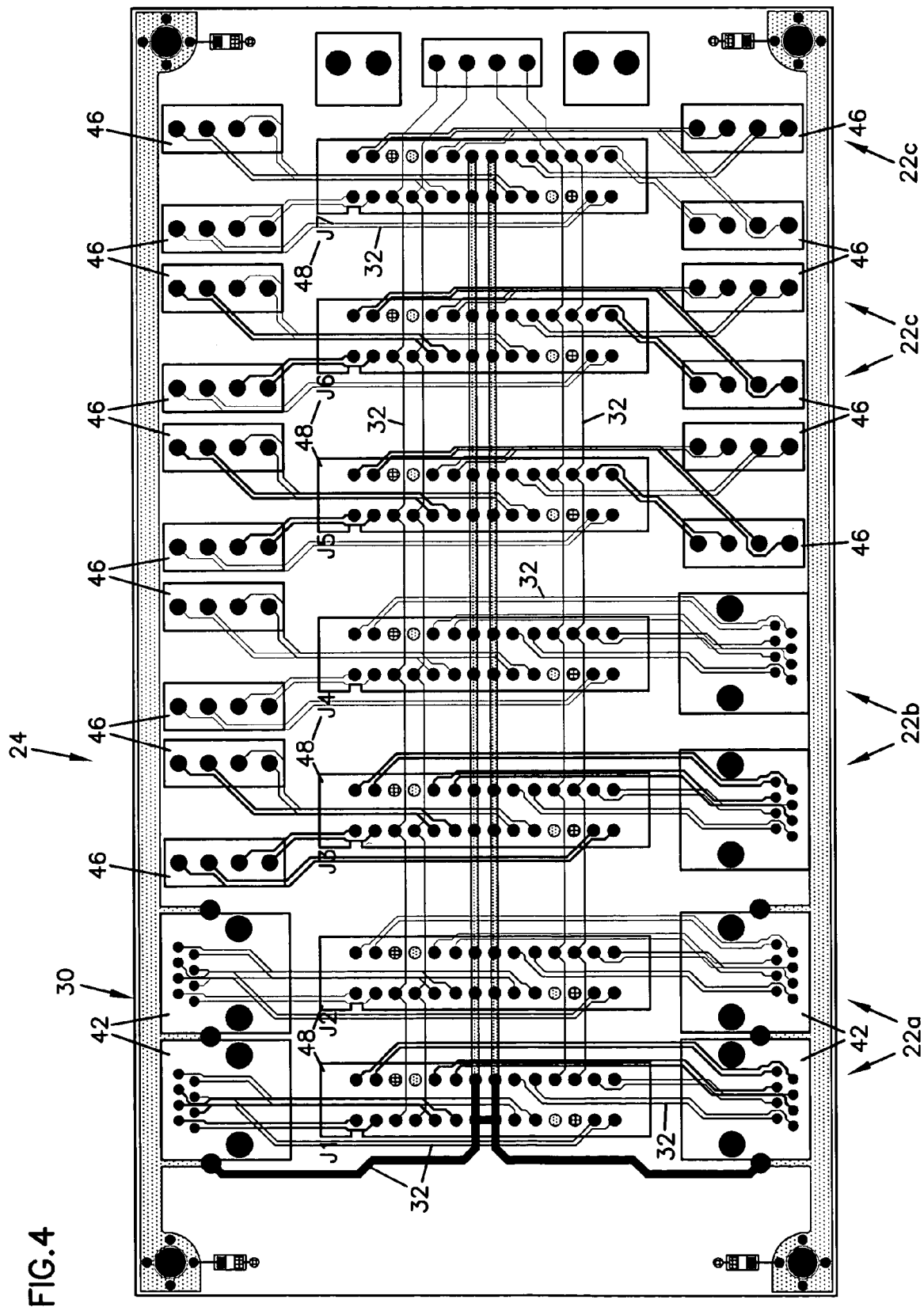
FIG. 4 shows the circuitry on a portion of the back plane.

Referring now FIG. 4, back plane 24 is shown with circuitry 30 linking to the pairs of termination locations 40 in the form of RJ45 jacks 42 and insulation displacement connectors 46. Circuitry 30 also links to the contact pairs of interconnect locations 48. As shown in FIG. 4, two RJ to RJ patching circuits 22a, two RJ to IDC patching circuits 22b, and three IDC to IDC patching circuits 22c are shown.

Referring now to FIG. 6, interconnect location 48 includes a housing 80 including a socket 82 for receiving a card edge of interconnect module 56. Contact pairs 84 include normally closed ends 86. Tips 88 electrically connect to back plane 24. Interconnect location 48 includes 14 contact pairs 84.

Figure 7:
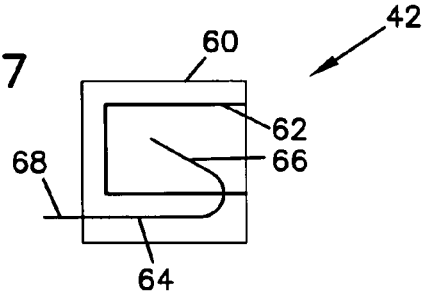
FIG. 7 is a side view of an RJ45 jack.

Referring now to FIG. 7, RJ45 jack 42 is shown including a housing 60 defining a socket 62. A spring 64 is positioned such that a spring end 66 is disposed within socket 62 for engaging plug 53 of patch cord 52. Tip 68 electrically connects to back plane 24. Typically, RJ45 jack 42 includes eight springs 64.

Figure 8:
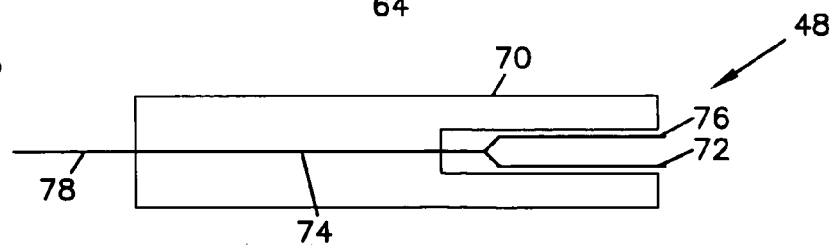
FIG. 8 is a side view of an insulation displacement contact.
Figure 12:
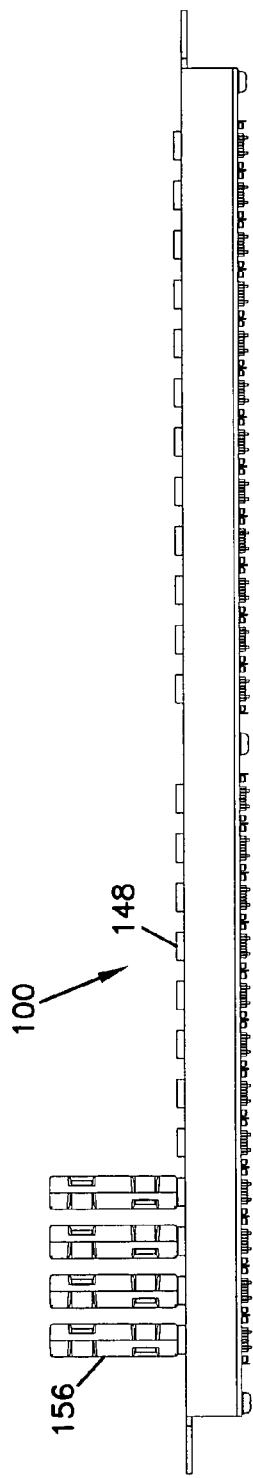
FIG. 12 is a top view of the patch panel of FIG. 9.
Figure 14:
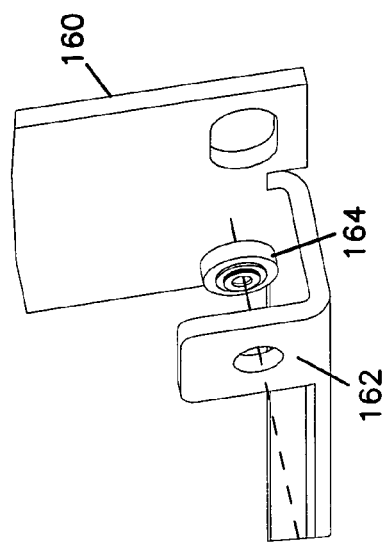
FIG. 14 is an enlarged view of a portion of the patch panel of FIG. 9.
Figure 13:
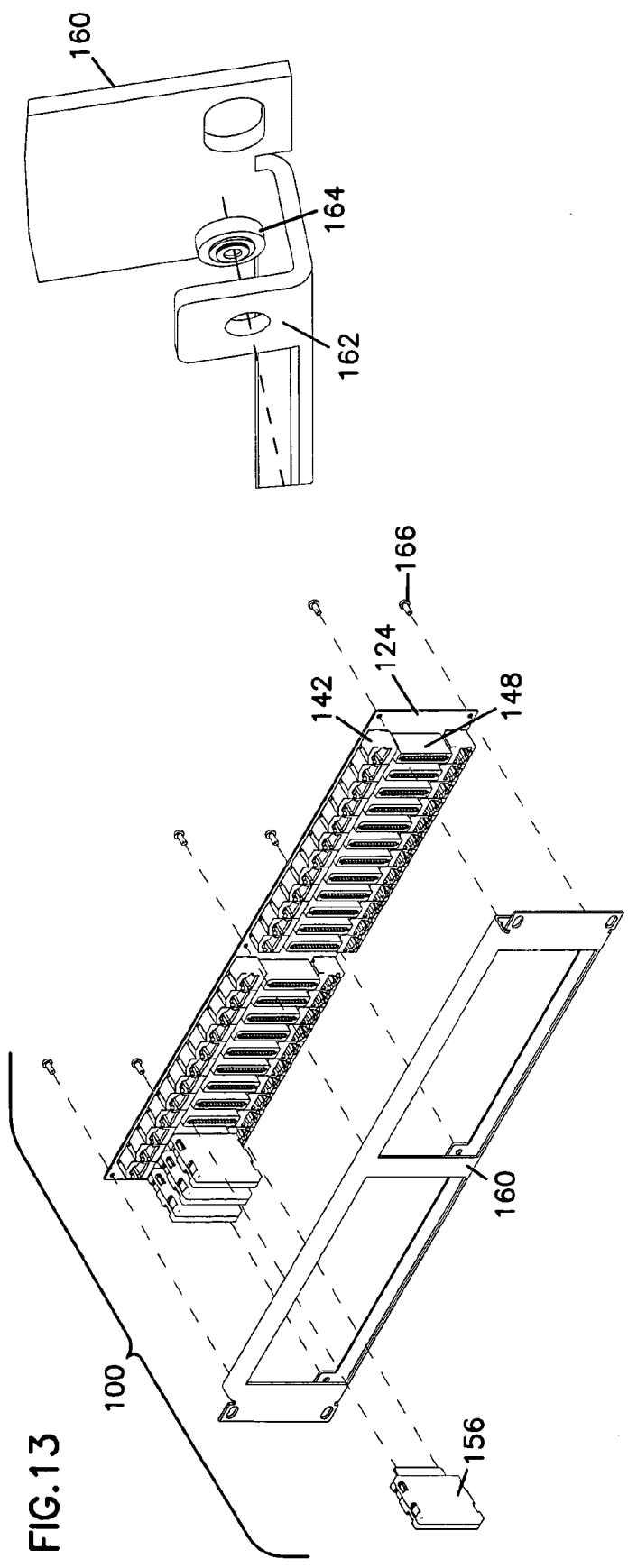
FIG. 13 is an exploded perspective view of the patch panel of FIG. 9.
Figure 15:
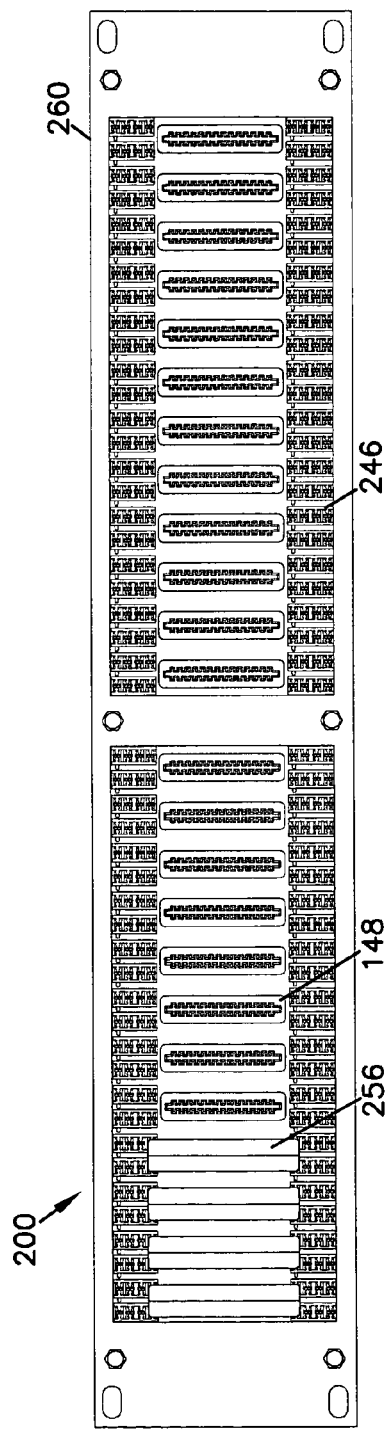
FIG. 15 is a front view of a third embodiment of a patch panel.
Figure 16:
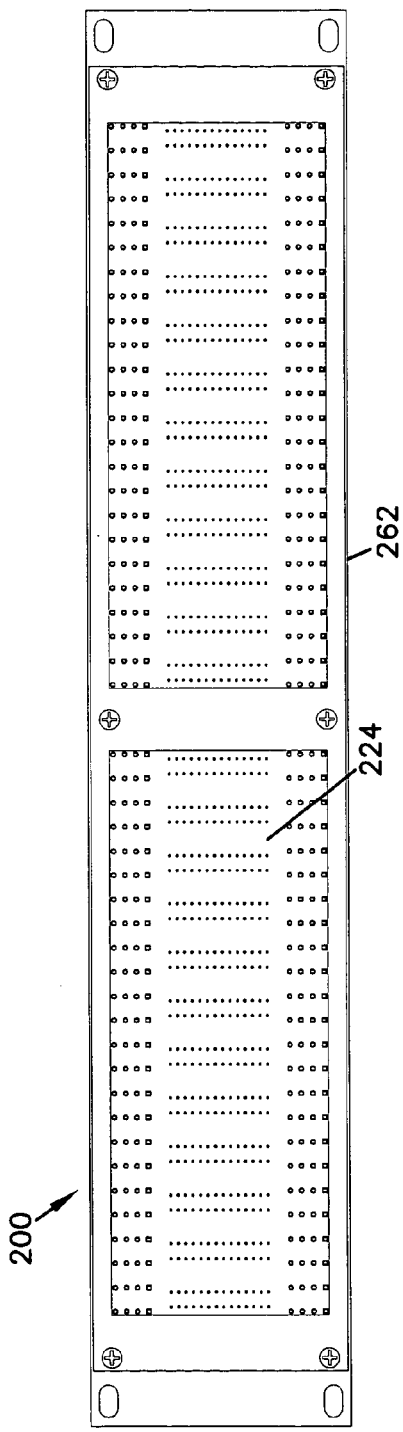
FIG. 16 is a back view of the patch panel of FIG. 15.
Figure 17:
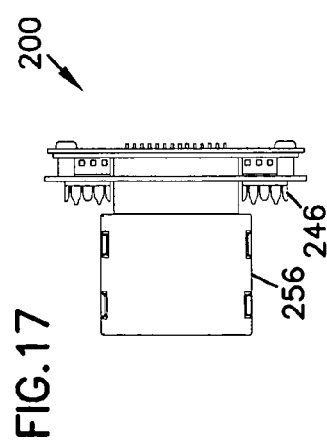
FIG. 17 is a side view of the patch panel of FIG. 15.
Figure 18:
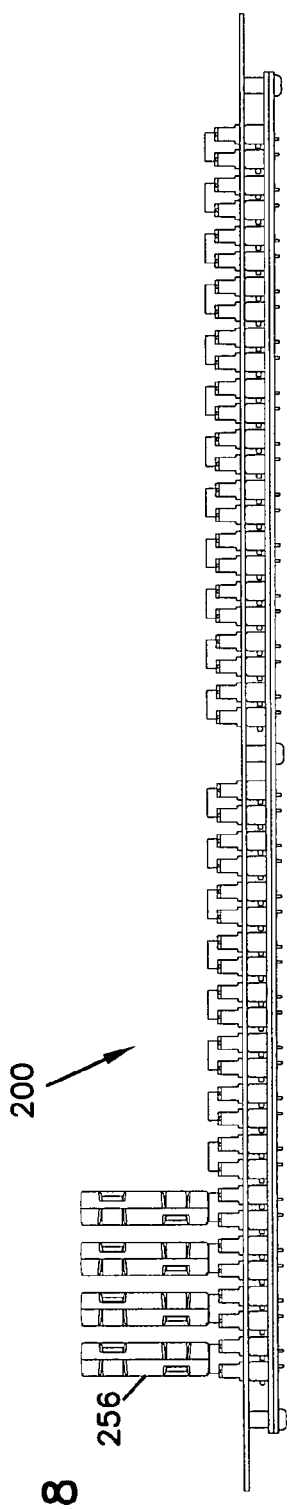
FIG. 18 is a top view of the patch panel of FIG. 15.
Figure 20:
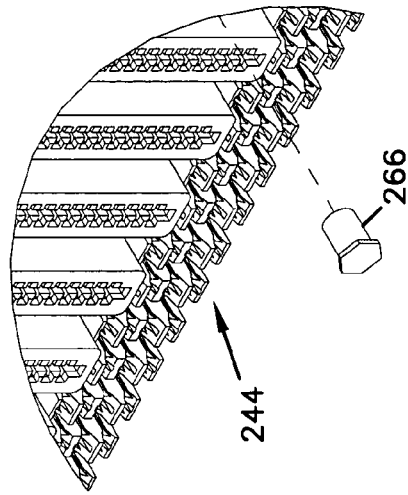
FIG. 20 is an enlarged view of a portion of the patch panel of FIG. 15.
Figure 19:
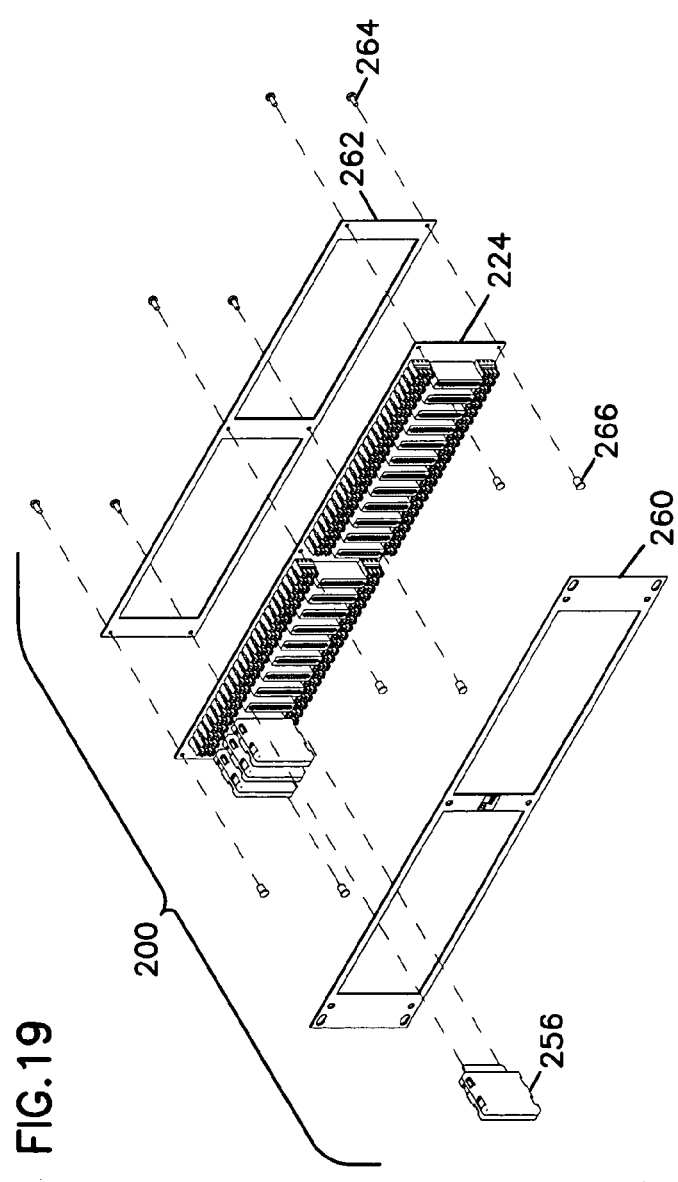
FIG. 19 is an exploded perspective view of the patch panel of FIG. 15.
Figure 24:
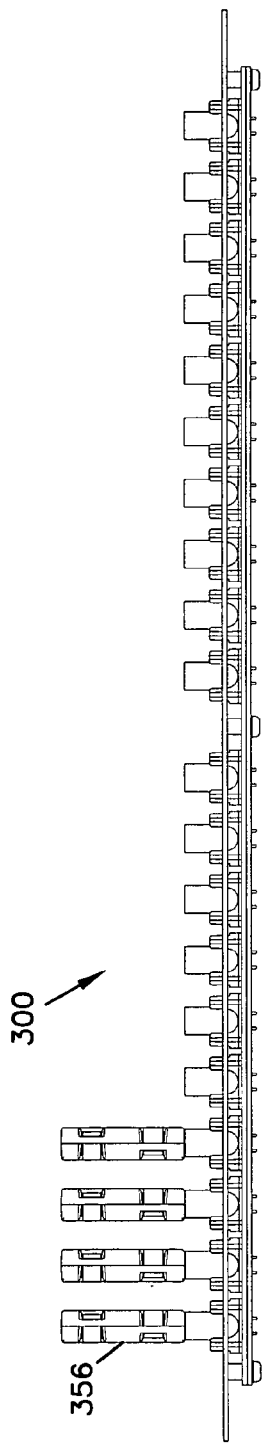
FIG. 24 is a top view of the patch panel of FIG. 21.
Figure 26:
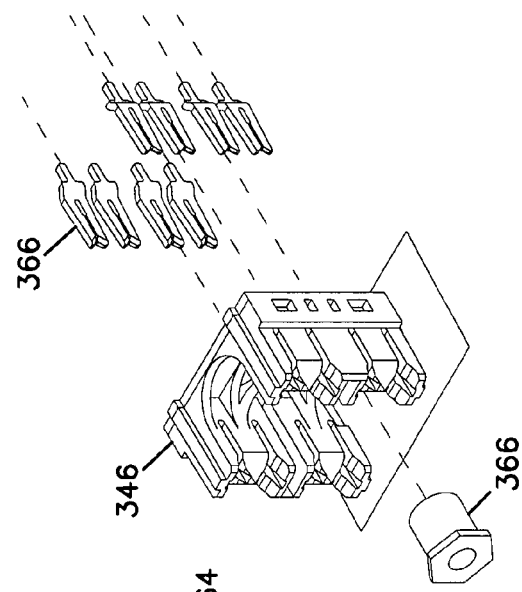
FIG. 26 is an enlarged view of a portion of the patch panel of FIG. 21.
Figure 25:
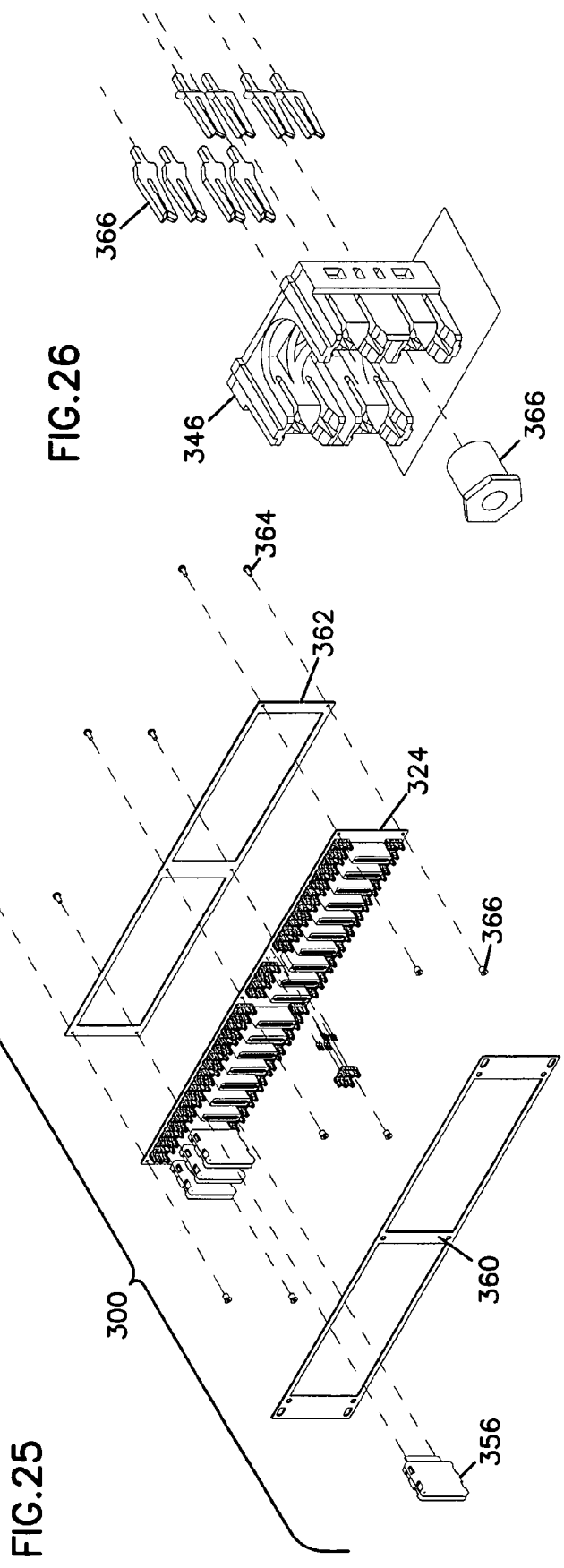
FIG. 25 is an exploded perspective view of the patch panel of FIG. 21.
Figure 27:
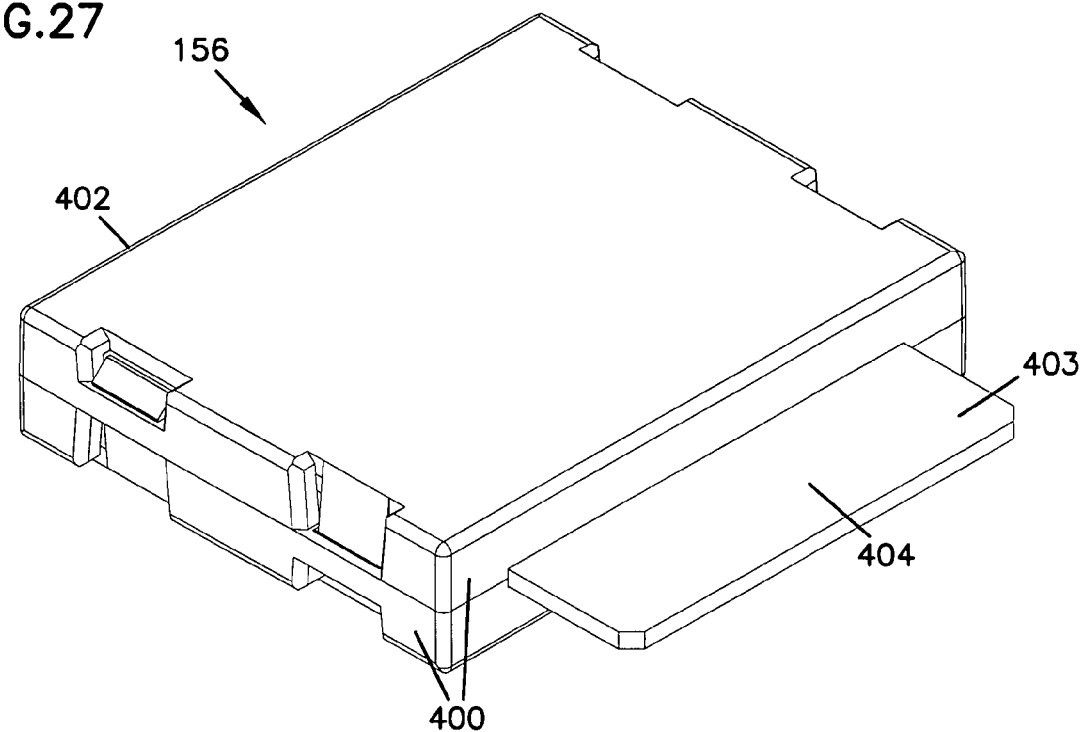
FIG. 27 is a perspective view of an interconnect module in accordance with one embodiment of the present invention.
Figure 28:
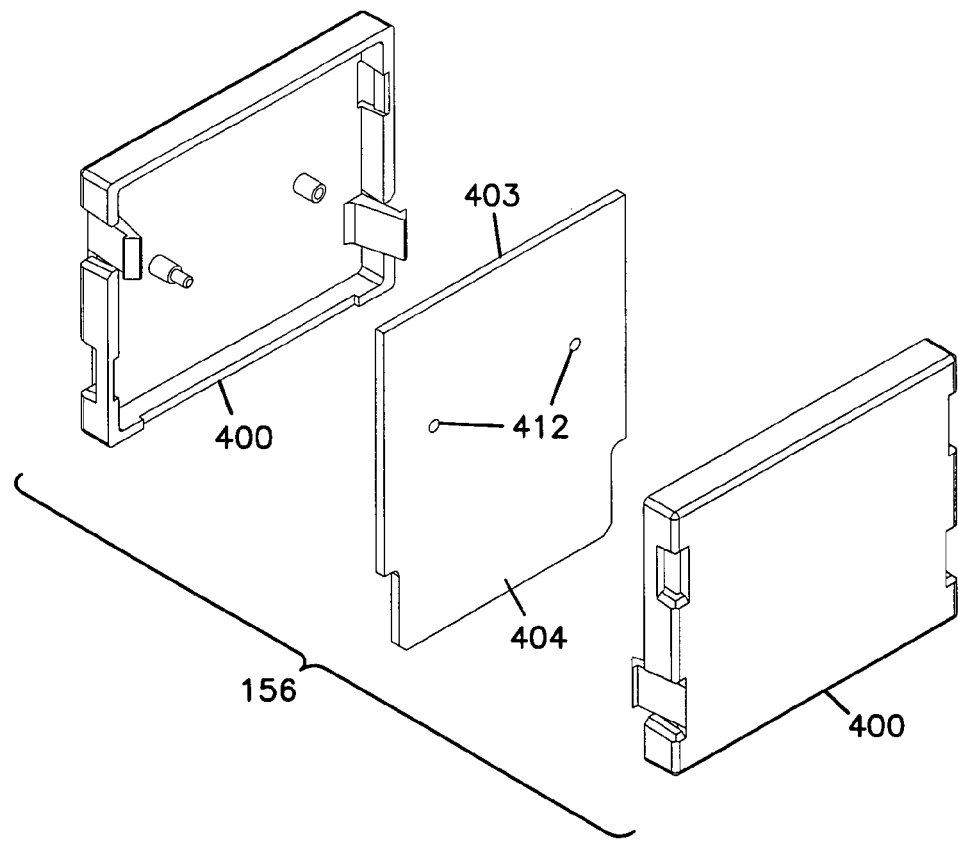
FIG. 28 is an exploded perspective view of the interconnect module of FIG. 27.
Figure 29:
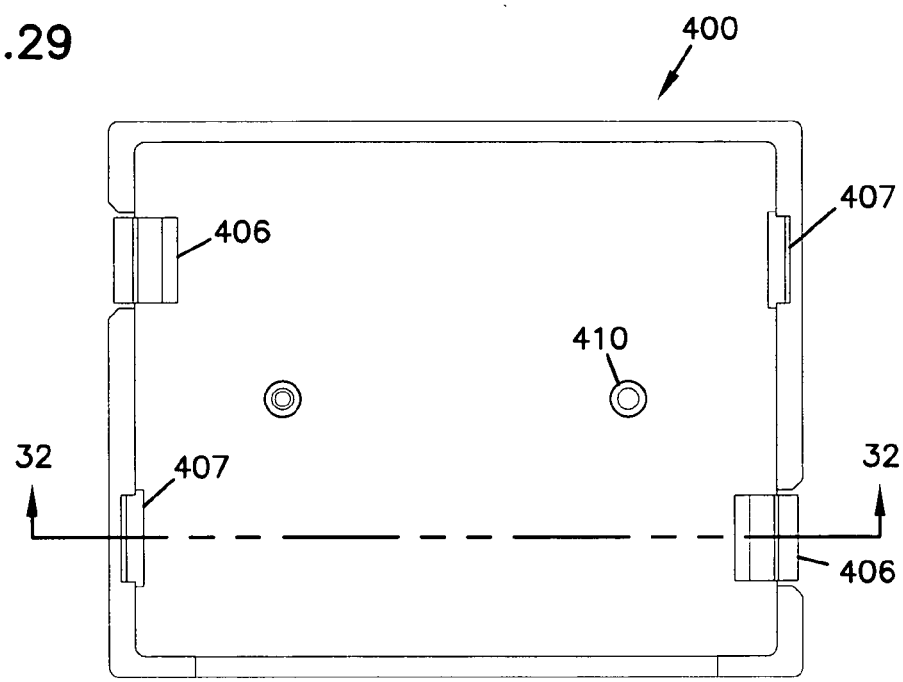
FIG. 29 is a plan view of one of the housings of the interconnect module of FIG. 27.
Figure 30:
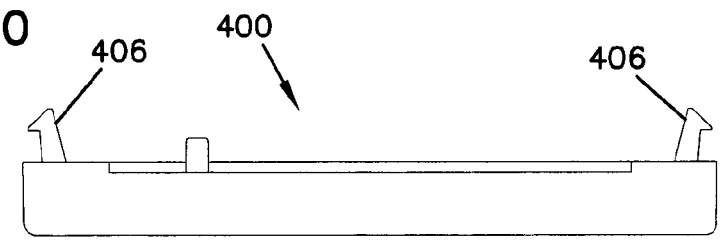
FIG. 30 is a first side view of the housing of FIG. 29.
Figure 31:
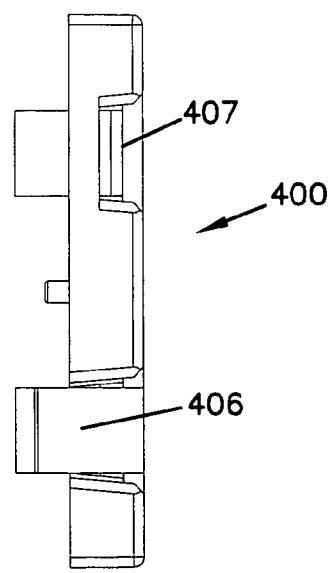
FIG. 31 is a second side view of the housing of FIG. 29.
Figure 32:
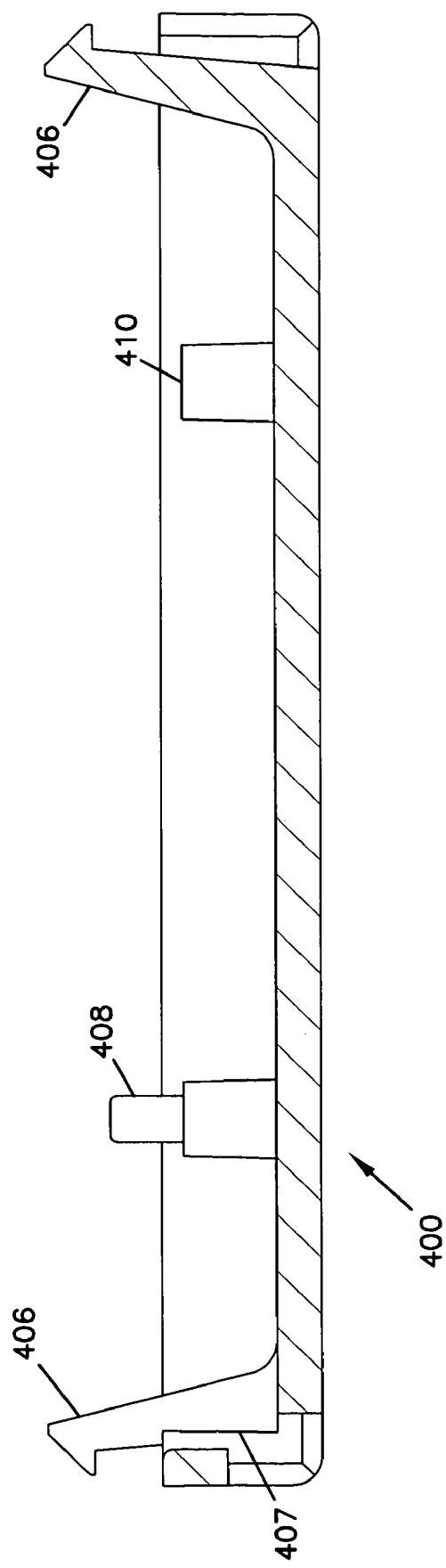
FIG. 32 is a cross-sectional side view of the housing of FIG. 29 similar to the view of FIG. 30.
Figure 33:
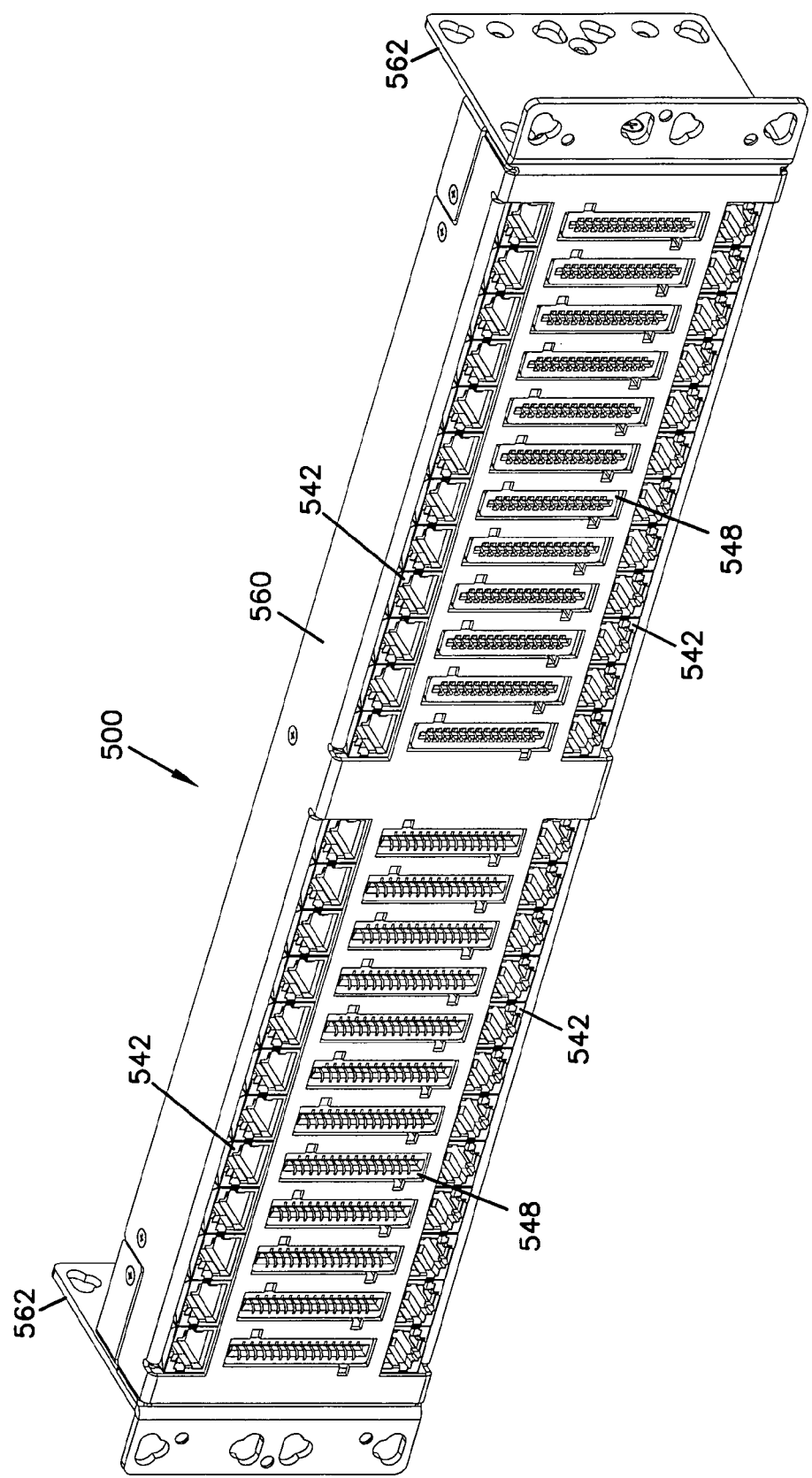
FIG. 33 is a perspective view of a fifth embodiment of a patch panel.
Figure 34:
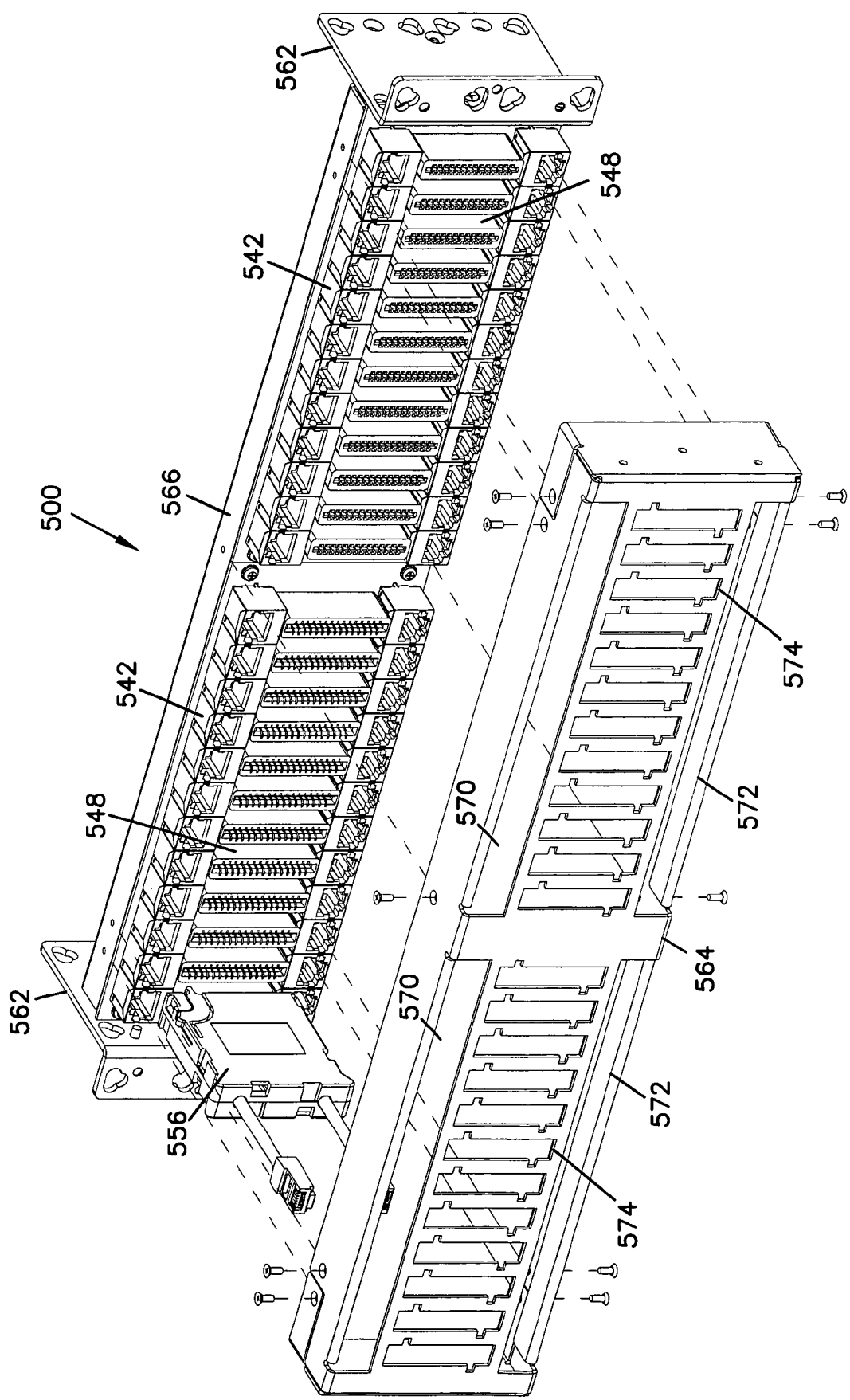
FIG. 34 is an exploded perspective view of the patch panel shown in FIG. 33.
Figure 35:
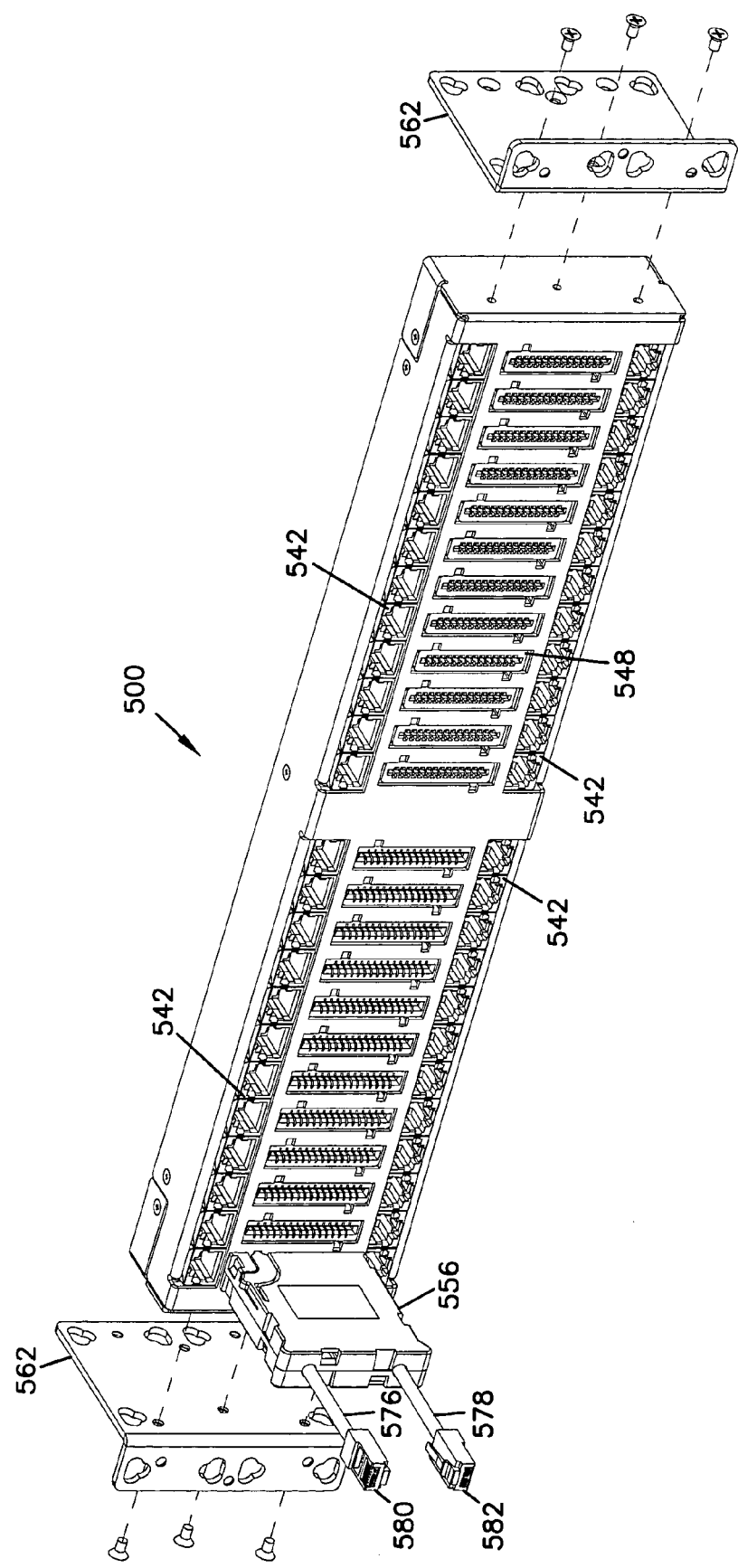
FIG. 35 is a further exploded perspective view of the patch panel of FIG. 33.
Figure 36:
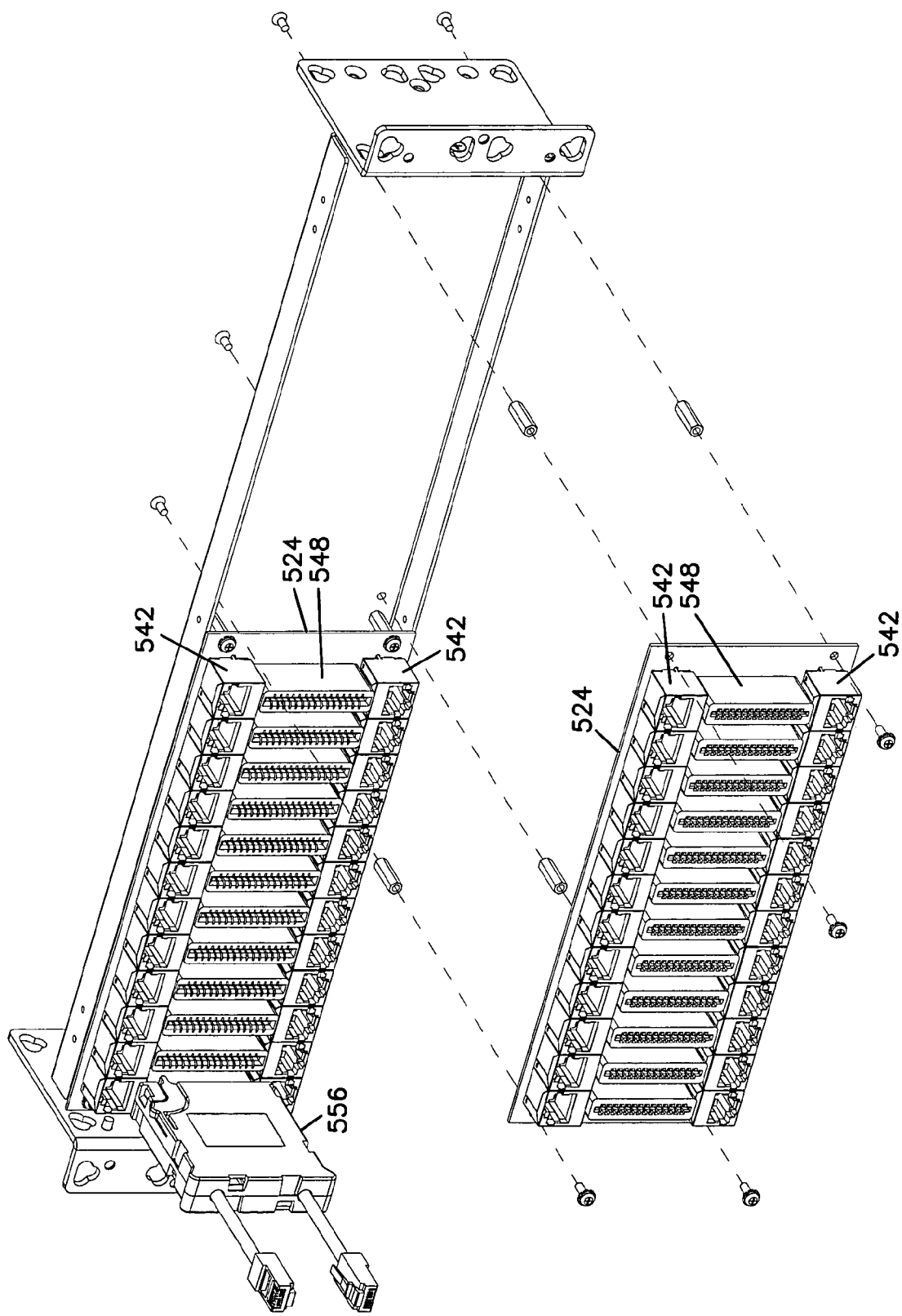
FIG. 36 is a further exploded perspective view of the patch panel of FIG. 33 with portions of the panel construction removed.
Figure 40:
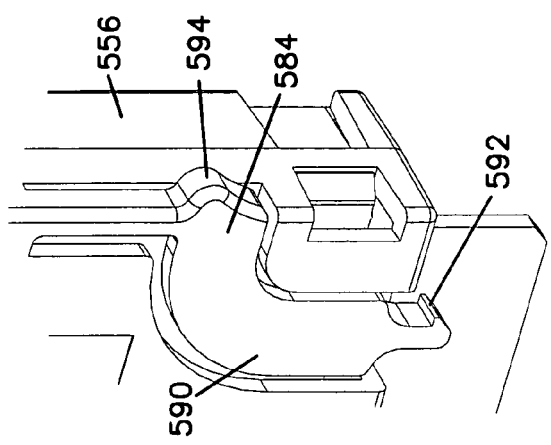
FIG. 40 is an enlarged view of a portion of the module showing a latch mechanism.
Figure 39:
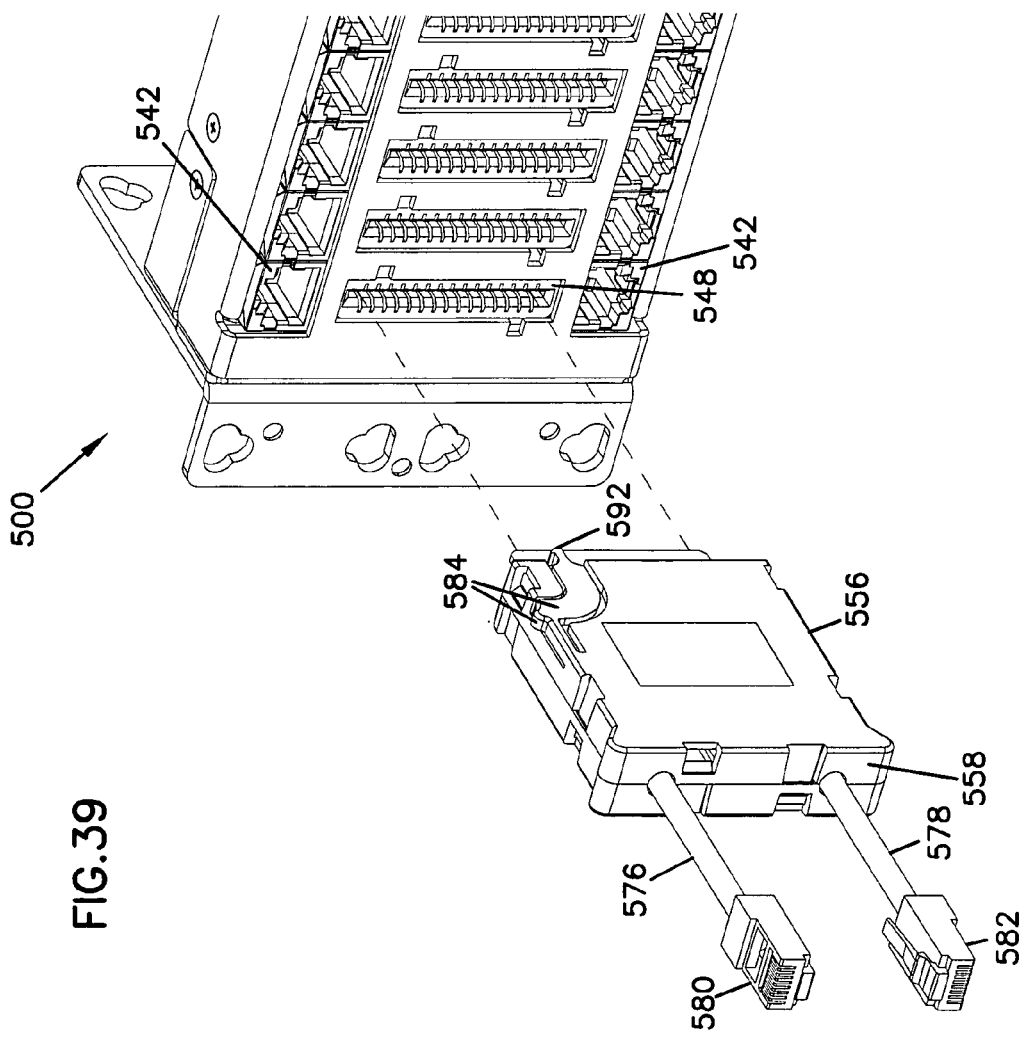
FIG. 39 is a perspective view of a portion of the patch panel of FIG. 33 showing the module disconnected from the interconnect location.
Figure 43:
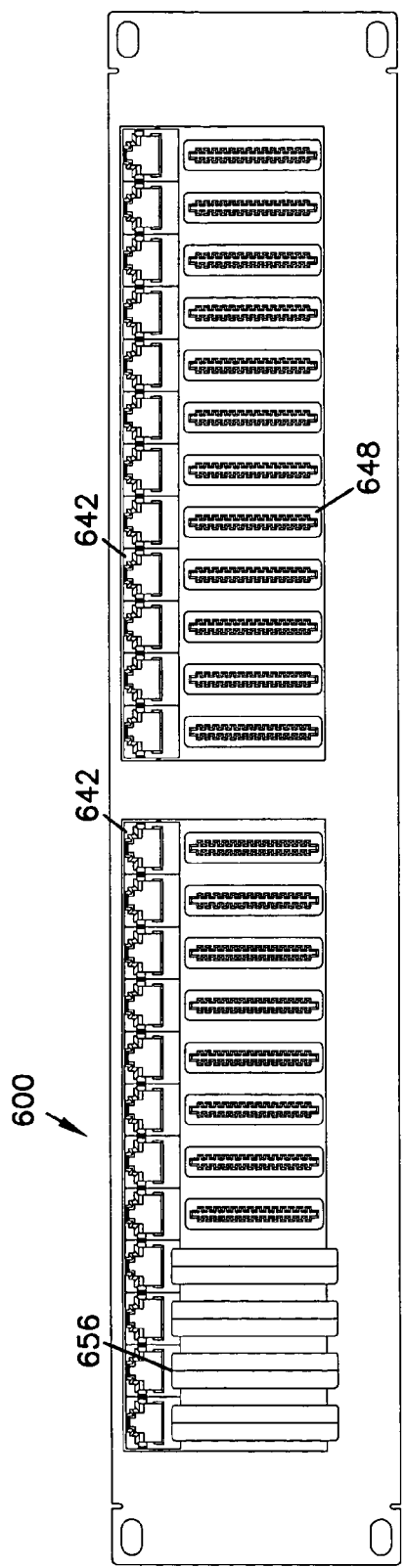
FIG. 43 is a front view of the patch panel of FIG. 41.
Figure 44:
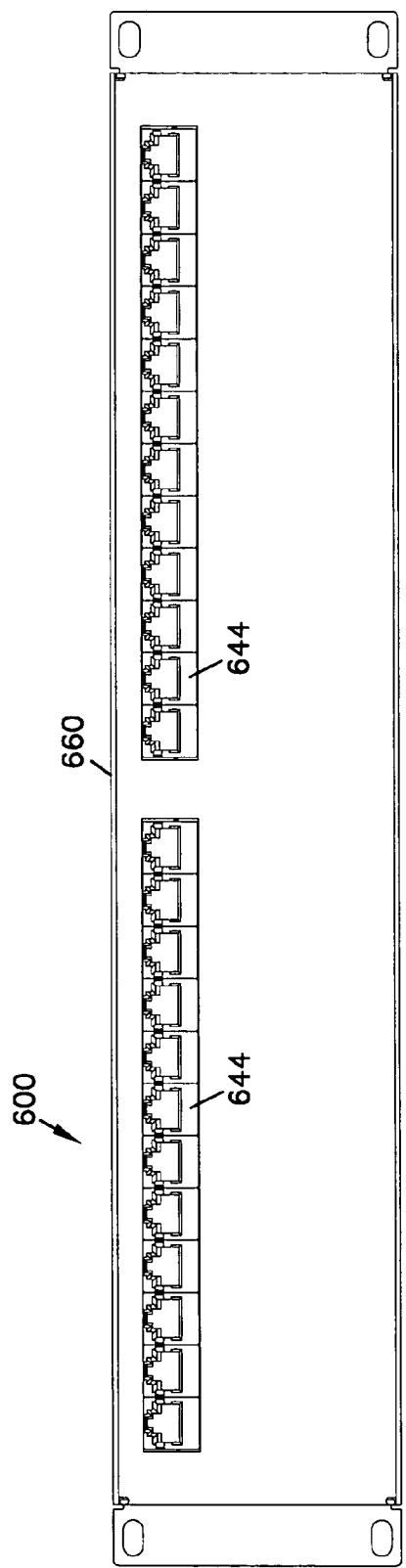
FIG. 44 is a rear view of the patch panel of FIG. 41.
Figure 45:
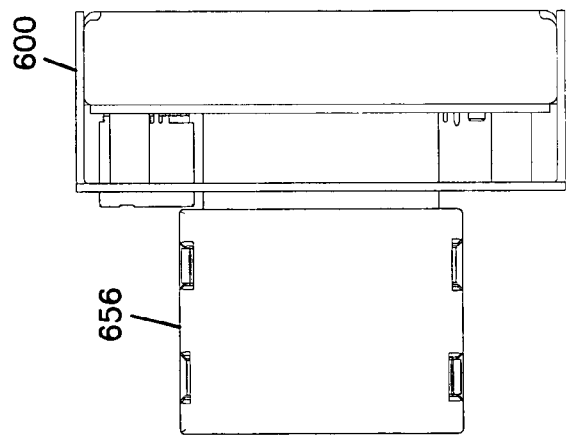
FIG. 45 is a side view of the patch panel of FIG. 41.
Figure 46:
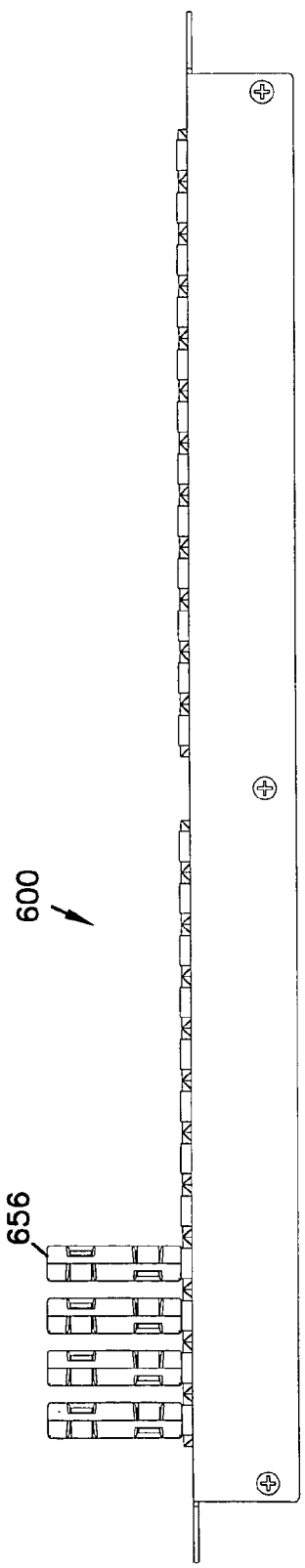
FIG. 46 is a bottom view of the patch panel of FIG. 41.
Figure 47:
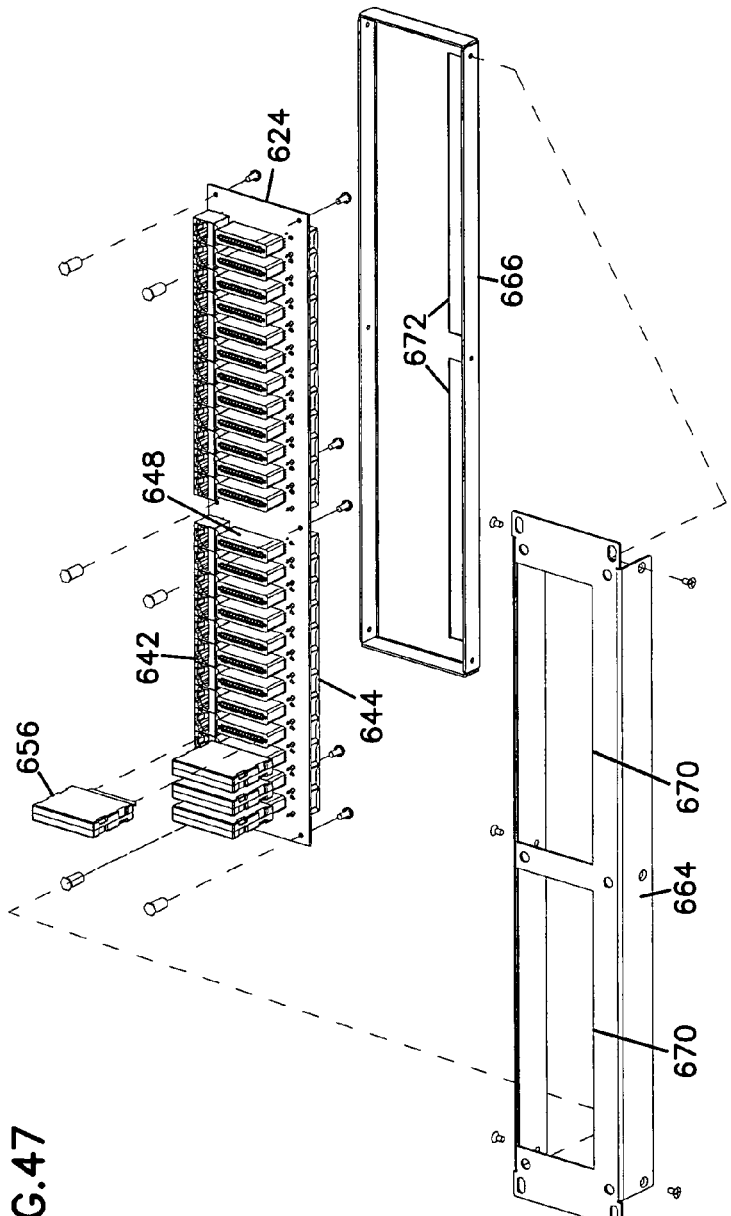
FIG. 47 is an exploded perspective view of the patch panel of FIG. 41.
Figure 48:
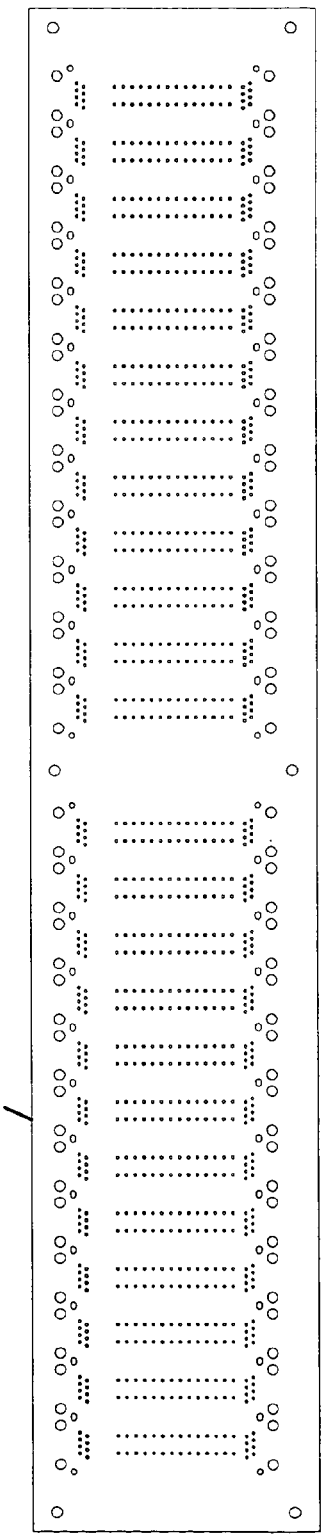
FIG. 48 is a front view of the printed circuit board of the patch panel of FIG. 41.

Referring now to FIG. 8, insulation displacement connector 46 is shown including a housing 70 which defines a socket 72 and holds a contact 74. Contact 74 includes a wire contacting end 76 for contacting a wire 55 of patch cord 54. An opposite end defines a tip 78 for electrically connecting to back plane 24. In the illustrated embodiment, each insulation displacement connector 46 includes four contacts 74.

Referring back to FIG. 5, module 56 includes a card edge or edge contact 90 for receipt in socket 82 of interconnect location 48. A front 92 includes the desired features for module 56, including test access ports. The ports can allow intrusive testing or access, or non-intrusive testing or access, such as a monitor. Module 56 includes circuit functions 94 including appropriate tracings and other circuit elements as needed. In the case of power over Ethernet, module 56 is preferably flippable, to send power out to either connector 40. In this manner, DC power can be simplexed with Ethernet data for transmission at one of connectors 40.

Patch panel 10 can be implemented as a patch through panel with access. The modules 56 can be added in the signal paths without disrupting signal service. If power and control functions are needed later, the modules can be added to back major surface 28 of back plane 24, with appropriately configured circuitry on back plane 24 to allow the power and control connections.

Referring now to FIGS. 9–14, a further embodiment of a patch panel 100 is shown. Back plane 124 includes RJ45 jacks 142 and interconnect locations 148 similar to RJ45 jacks 42 and interconnect locations 48 noted above. Interconnect locations 148 receive interconnect modules 156. A panel construction 160 holds back plane 124. Fasteners 166 are received by flanges 162 of housing construction 160. A PEM fastener 164 with internal threads mounted to flange 162 can be used to interface with fasteners 166.

Referring now to FIGS. 15–20, a still further embodiment of a patch panel 200 is shown. Back plane 224 includes insulation displacement connectors 246 and interconnect locations 248 similar to insulation displacement connectors 46 and interconnect locations 48 noted above. Interconnect locations 248 receive interconnect modules 256. A panel construction 260, 262 holds back plane 224. Fasteners 264 mount panel constructions 260, 262 together. A PEM standoff 266 with internal threads mounted to panel construction 260 can be used between back plane 224 and panel construction 260.

Referring now to FIGS. 21–26, a further embodiment of a patch panel 300 is shown. Back plane 324 includes insulation displacement connectors 346 and interconnect locations 348. Interconnect locations 348 receive interconnect modules 356. A similar panel construction 360, 362 holds back plane 324 in a manner as noted above for patch panel 200. Instead of insulation displacement connectors 246, an alternative embodiment of an insulation displacement connector 346 is used, including electrical contacts 366. Interconnect locations 348 are similar to interconnect locations 48, 148, 248 noted above.

Panel constructions 260, 262 and 360, 362 are similarly arranged. Panel constructions 262, 362 are positioned adjacent to a rear side of back planes 224, 324, respectively. Rear panel constructions 262, 362 support insulation displacement connectors 246, 346 during the punch down operations to connect them to the individual wires of the patch cords.

Referring now to FIGS. 27–32, interconnect module 156 is shown in greater detail. Similar constructions for interconnect modules 256, 356 are provided. Interconnect module 156 includes two identical housings 400 mated together around a circuit board 403. A card edge 404 is defined by a protruding portion of circuit board 403 which protrudes outside of housings 400. Housings 400 are identical in shape, so as to reduce manufacturing costs. Tabs 406 and slots 407 mate together to snap housings 400 together. Standoffs 408, 410 position circuit board 403 between housings 400. Standoff 408 is in the form of a peg or post, and standoff 410 is in the form of a recess for receiving the post. Posts 408 are received in holes 412 through circuit board 403. A front 402 of module 156 can define the access ports if provided as part of the functionality of the modules.

Referring now to FIGS. 33–40, a further embodiment of a patch panel 500 is shown. Patch panel 500 includes front accessible RJ45 jacks 542. Pairs of RJ45 jacks 542 are linked electrically through back plane 524. Front accessible interconnect locations 548 allow selective access to the electrical connection between the RJ45 jack pairs 542.

Patch panel 500 includes a panel construction 560 including brackets 562 for mounting to a rack or frame. A front panel portion 564 and a rear panel portion 566 enclose back plane 524. Front panel portion includes openings 570, 572 for the RJ45 jacks 542. Front panel portion 564 further includes openings 574 for interconnect locations 548.

As shown in FIGS. 34–40, an interconnect module 556 is mounted to one of interconnect locations 548. Module 556 includes an interface end 557 including a card edge 559 for mating with one of the interconnect locations 548. An opposite end 558 of module 556 includes two patch cords 576, 578 terminating in plugs 580, 582. As illustrated, patch cords 576, 578 are relatively short. Typically, patch cords 576, 578 will extend several feet, depending on the desired usage. Patch cords 576, 578 and plugs 580, 582 are used to connect module 556 to other equipment, including test equipment. Through patch cords 576, 578 and plugs 580, 582, the pairs of RJ45 jacks 542 can be electrically linked to the test equipment through interconnect location 548.

Module 556 preferably includes a latch or lock 584 in some implementations. Latch 584 helps assist module 556 from being removed from the interconnect location 548 until the desired time. Such a latch may be particularly useful for modules 556 incorporating surge protection. With latch 584, module 556 cannot inadvertently become loosened or fall out of interconnect location 548. Latch 584 engages a notch 586 in front panel portion 564. In the illustrated embodiment, latch 584 includes a flexible tab 590 including a catch 592 for engaging one of notches 586. In the illustrated embodiment, a release button 594 is engaged by the user to move tab 590 thereby removing catch 592 from notch 586, and allowing removal of module 556 from the interconnect location 548. In the illustrated embodiment, two latches 584 are provided on opposite sides of module 556, one latch 584 engageable with each notch 586.

Referring now to FIGS. 41–48, a further embodiment of a patch panel 600 is shown. Panel 600 includes a set of front RJ45 jacks 642. Instead of a second set of RJ45 jacks mounted on the front, panel 600 includes rear mounted RJ45 jacks 644. In panel 600, one RJ45 jack 642 is electrically linked to one of the rear RJ45 jacks 644. Interconnect locations 648 allow selective access to the RJ45 jack pairs 642, 644. In panel 600, interconnect locations 648 are positioned on the front of panel 600.

A panel construction 660 encloses back plane 624 and allows for access to front and rear RJ45 jacks 642, 644 and interconnect locations 648. Panel construction 660 includes brackets 662 for mounting to a rack or frame. A front panel portion 664 includes openings 670 for front RJ45 jacks 642 and for interconnect locations 648. Rear panel portion 666 defines openings 672 for rear RJ45 jacks 644.

Modules 656 shown in FIGS. 41–48 are of the type not needing patch cord access. Further, modules 656 do not include any latch mechanism of the type described for the embodiment of FIGS. 33–40.

As noted above with the various embodiments for the patch panels, a variety of termination locations can be provided including RJ45 jacks, and insulation displacement connectors (IDC). Other patch cable connections are anticipated, such as RJ21. Furthermore, with respect to interconnect locations which allow selective access to the termination locations, a variety of connection interfaces are anticipated. Also, in the various embodiments noted above, the termination locations can be positioned entirely on one side of the panel, or on both sides. In further embodiments, the termination locations can both be positioned on an opposite side of the panel relative to the interconnect locations, as desired. With respect to latching or locking arrangements between the interconnect modules and the interconnect locations, a variety of latches, locks and fasteners are anticipated for more securely holding the modules to the panels.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A method of patching telecommunications cables comprising:

providing a back plane including a front major surface and a back major surface, and including a plurality of pairs of cable termination locations and a plurality of interconnect locations sized to receive circuit modules, each of the interconnect locations electrically connected to one of the pairs of termination locations;

electrically connecting a plurality of pairs of telecommunications cables to the pairs of termination locations;

electrically connecting a circuit module to one of the interconnect locations, wherein the circuit module is electrically connected to one of the pairs of termination locations.

2. The method of claim 1, further comprising the steps of:

electrically connecting a power module to an opposite back major surface of the back plane;

electrically connecting a control module to the back major surface of the back plane;

wherein each of the power module and the control module are electrically connected to the interconnect locations.

3. The method of claim 1, further comprising the step of:

locking the circuit module to the interconnect location.

4. The method of claim 2, further comprising the steps of:

unlocking the circuit module from the interconnect location;

removing the circuit module from the interconnect location.

5. The method of claim 1, further comprising the step of:

monitoring one or more pairs of termination locations on a monitor port provided on the circuit module.

6. The method of claim 1, wherein electrically connecting the circuit module to one of the interconnect locations electrically disconnects the pair of termination locations.

7. The method of claim 2, wherein electrically connecting the power module to one of the interconnect locations electrically connects the pair of termination locations.

* * * * *

UNITED STATES PATENT AND TRADEMARK OFFICE
CERTIFICATE OF CORRECTION

PATENT NO. : 7,200,929 B2  Page 1 of 1
APPLICATION NO. : 10/871698
DATED : April 10, 2007
INVENTOR(S) : Coffey et al.

It is certified that error appears in the above-identified patent and that said Letters Patent is hereby corrected as shown below:

Col. 8, line 7, claim 4: "claim 2," should read --claim 3,--

Signed and Sealed this

Twenty-fifth Day of December, 2007

JON W. DUDAS
*Director of the United States Patent and Trademark Office*